US012627914B2

(12) United States Patent
Lee et al.

(10) Patent No.: US 12,627,914 B2
(45) Date of Patent: May 12, 2026

(54) SOUND APPARATUS AND VEHICULAR APPARATUS COMPRISING THE SAME

(71) Applicant: LG Display Co., Ltd., Seoul (KR)

(72) Inventors: Seonwook Lee, Paju-si (KR); Seungo Jeon, Paju-si (KR); Daeho Kim, Paju-si (KR); Daewon Kim, Paju-si (KR); Seungwoo Baek, Paju-si (KR); DoHyeong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 151 days.

(21) Appl. No.: 18/521,602

(22) Filed: Nov. 28, 2023

(65) Prior Publication Data

US 2024/0187768 A1 Jun. 6, 2024

(30) Foreign Application Priority Data

Dec. 1, 2022 (KR) ........................ 10-2022-0165763

(51) Int. Cl.
H04R 1/02 (2006.01)
H04M 1/02 (2006.01)
(Continued)

(52) U.S. Cl.
CPC .............. H04R 1/025 (2013.01); H04R 7/04 (2013.01); H04R 17/00 (2013.01); H04M 1/026 (2013.01); H04M 1/0274 (2013.01); H04M 1/03 (2013.01); H04R 7/045 (2013.01); H04R 7/12 (2013.01); H04R 9/02 (2013.01); H04R 9/06 (2013.01); H04R 2400/11 (2013.01); H04R 2440/05 (2013.01); H04R

*2499/11* (2013.01); *H04R 2499/13* (2013.01); *H04R 2499/15* (2013.01); *H10K 59/00* (2023.02)

(58) Field of Classification Search
CPC .... H04R 1/025; H04R 17/00; H04R 2499/13; H04R 9/06; H04R 2499/15; H04R 7/04; H04R 2400/11; H04M 1/026; H04M 1/0274; H04M 1/03; H10K 59/00
See application file for complete search history.

(56) References Cited

U.S. PATENT DOCUMENTS 6,671,012 B1 * 12/2003 Tanaka .............. G02F 1/133308
361/679.26
8,259,930 B2 9/2012 Kawasaki et al.
(Continued)

FOREIGN PATENT DOCUMENTS

CN 108881523 A * 11/2018 ............ H04M 1/026
EP 3499052 A1 * 6/2019 ........... G09F 9/3026
(Continued)

OTHER PUBLICATIONS

Japan Patent Office, Office Action, Japanese Patent Application No. 2023-204257, Jan. 8, 2025, 17 pages.
(Continued)

*Primary Examiner* — Carolyn R Edwards
*Assistant Examiner* — Kuassi A Ganmavo
(74) *Attorney, Agent, or Firm* — Fenwick & West LLP

(57) ABSTRACT

A sound apparatus comprises a vibration member, an enclosure at a rear surface of the vibration member, a connection member between the vibration member and the enclosure, movably supporting an edge of the vibration member, and a vibration apparatus vibrating the vibration member.

20 Claims, 9 Drawing Sheets

(51) Int. Cl.

| | |
|---|---|
| *H04M 1/03* | (2006.01) |
| *H04R 7/04* | (2006.01) |
| *H04R 7/12* | (2006.01) |
| *H04R 9/02* | (2006.01) |
| *H04R 9/06* | (2006.01) |
| *H04R 17/00* | (2006.01) |
| *H10K 59/00* | (2023.01) |

(56) References Cited

U.S. PATENT DOCUMENTS

| | | | | |
|---|---|---|---|---|
| 8,548,159 | B2 | 10/2013 | Kawasaki et al. | |
| 11,776,519 | B2 | 10/2023 | Kho et al. | |
| 11,950,035 | B2 | 4/2024 | Lee et al. | |
| 12,047,721 | B2 | 7/2024 | Kim et al. | |
| 12,167,188 | B2 | 12/2024 | Lee et al. | |
| 2005/0025330 | A1* | 2/2005 | Saiki | H04R 1/2834 |
| | | | | 381/388 |
| 2009/0101384 | A1 | 4/2009 | Kawasaki et al. | |
| 2009/0103257 | A1* | 4/2009 | Maeda | G06F 1/1656 |
| | | | | 361/679.27 |
| 2012/0000687 | A1 | 1/2012 | Kawasaki et al. | |
| 2012/0050639 | A1* | 3/2012 | Kim | G02F 1/133308 |
| | | | | 349/58 |
| 2019/0294286 | A1* | 9/2019 | Lin | G06F 3/0412 |
| 2020/0043991 | A1* | 2/2020 | Noh | H04R 17/00 |
| 2020/0059733 | A1* | 2/2020 | Shin | H04R 17/00 |
| 2020/0177997 | A1* | 6/2020 | Gomes | H04R 7/045 |
| 2021/0304722 | A1* | 9/2021 | Kho | H04R 17/00 |
| 2021/0352390 | A1 | 11/2021 | Lee et al. | |
| 2022/0070563 | A1 | 3/2022 | Kim et al. | |
| 2022/0182744 | A1 | 6/2022 | Han et al. | |
| 2022/0371051 | A1 | 11/2022 | Kim et al. | |
| 2023/0395054 | A1 | 12/2023 | Kho et al. | |
| 2024/0098396 | A1 | 3/2024 | Lee et al. | |
| 2024/0365037 | A1 | 10/2024 | Kim et al. | |

FOREIGN PATENT DOCUMENTS

| | | | | | |
|---|---|---|---|---|---|
| EP | | 3890351 | A1 | 10/2021 | |
| JP | | 2007-053610 | A | 3/2007 | |
| JP | | 2009-105610 | A | 5/2009 | |
| JP | | 2019-161619 | A | 9/2019 | |
| JP | | 2021-159917 | A | 10/2021 | |
| JP | | 2021-180486 | A | 11/2021 | |
| JP | | 2022-042006 | A | 3/2022 | |
| JP | | 2022-172467 | A | 11/2022 | |
| KR | 10-2022-0150820 | | A | 11/2022 | |
| WO | WO 2009/063568 | | A1 | 5/2009 | |
| WO | WO-2019146095 | | A1* | 8/2019 | H04R 1/288 |

OTHER PUBLICATIONS

European Patent Office, Extended European Search Report, European Patent Application No. 23211992.5, Mar. 27, 2024, eight pages.

\* cited by examiner

137

Y
X ← ⊙ Z

137

Y
X ← ⊙ Z

520: 520A ~ 520C
530B: 530B2, 530B3

530: 530A, 530B, 530D, 530F, 530J
530D: 530D1 ~ 530D4

540: 540C
⊡ : 10

⊙ : WS

SOUND APPARATUS AND VEHICULAR APPARATUS COMPRISING THE SAME

CROSS-REFERENCE TO RELATED APPLICATION

This application claims the benefit of Republic of Korea Patent Application No. 10-2022-0165763 filed on Dec. 1, 2022, which is hereby incorporated by reference in its entirety.

BACKGROUND

Technical Field

The present disclosure relates to a sound apparatus and a vehicular apparatus comprising the same.

Description of the Related Art

An apparatus includes a separate speaker or a sound apparatus to provide sound. When a speaker is disposed in the apparatus, a problem occurs in that there is a restriction in design and space arrangement of the apparatus due to a space occupied by the speaker.

The speaker applied to the apparatus may be, for example, an actuator that includes a magnet and a coil. When the actuator is applied to the apparatus, a problem occurs in that the apparatus is thick. In this respect, a piezoelectric device that can implement a thin thickness has received attention.

The piezoelectric device has brittleness characteristics and thus has a problem in that it is easily damaged by external shock, whereby reliability in sound reproduction is low. In addition, when a speaker such as a piezoelectric device is applied to a flexible apparatus, a problem occurs in that the piezoelectric device is damaged due to brittleness characteristics.

SUMMARY

Therefore, the inventors of the present disclosure have recognized the aforementioned problems and carried out various studies and experiments for implementing a sound apparatus that may improve sound quality and sound pressure characteristics. The inventors of the present disclosure have invented a new sound apparatus, which can improve sound quality and sound pressure characteristics through various studies and experiments, and a vehicular apparatus comprising the same.

An aspect of the present disclosure is directed to providing a sound apparatus, which can generate vibration or sound by vibrating a vibration member and improving sound characteristics and/or sound pressure characteristics, and a vehicular apparatus comprising the same.

The objects of the present disclosure are not limited to the aforesaid, but other objects not described herein will be clearly understood by those skilled in the art from descriptions below.

A sound apparatus according to an embodiment of the present disclosure may include a vibration member, an enclosure at a rear surface of the vibration member, a connection member between the vibration member and the enclosure, and a vibration apparatus vibrating the vibration member. The connection member may movably support an edge of the vibration member.

A vehicular apparatus according to an embodiment of the present disclosure may include an exterior material, an interior material covering the exterior material, and one or more sound generating apparatuses in the exterior material, in the interior material and/or between the exterior material and the interior material. The one or more sound generating apparatuses may include a vibration member, an enclosure at a rear surface of the vibration member, a connection member between the vibration member and the enclosure, and a vibration apparatus vibrating the vibration member. The connection member may movably support an edge of the vibration member. One or more of the interior material and the exterior material may output sound in accordance with vibration of the one or more sound generating apparatuses.

Details according to various embodiments of the present disclosure in addition to the above objects are included in the detailed description and drawings.

A sound apparatus according to an embodiment of the present disclosure may be configured to vibrate a vibration member or a display panel, and thus, may generate a sound so that the sound travels in a forward direction of the vibration member or the display panel.

A sound apparatus according to an embodiment of the present disclosure, may provide uniform sound characteristics and/or sound pressure characteristics to the front, rear, and sides thereof.

A sound apparatus according to an embodiment of the present disclosure, may include a connection member between the vibration member and the enclosure, and thus a peak and/or dip phenomenon at a frequency in the middle/low-pitched range and/or the high-pitched range may be minimized or prevented.

A sound apparatus according to an embodiment of the present disclosure, may include a buffer member, thus the vibration device may be protected from external impact, and cracks or the like which may occur during the transportation process or the attachment process of the vibration device may be reduced.

The details of the present disclosure described in technical problem, technical solution, and advantageous effects do not specify essential features of claims, and thus, the scope of claims is not limited by the details described in detailed description.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
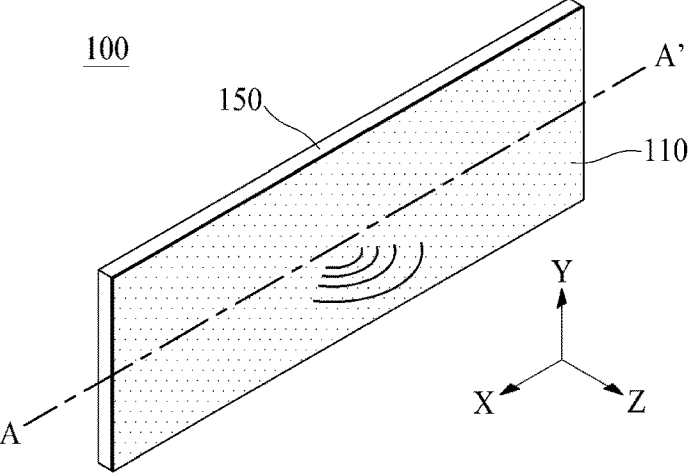
FIG. 1 illustrates a sound apparatus according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element or layer is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

Figure 2:
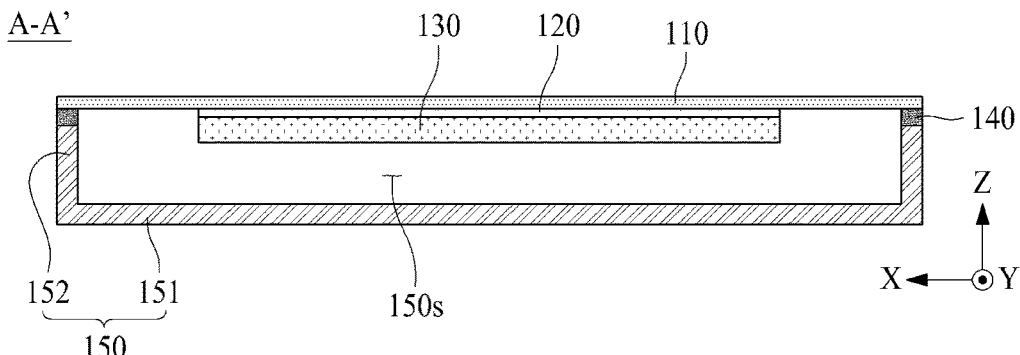
FIG. 2 is a cross-sectional view taken along line A-A' illustrated in FIG. 1, according to an embodiment of the present disclosure.

FIG. 1 illustrates a sound apparatus according to an embodiment of the present disclosure. FIG. 2 is a cross-sectional view taken along line A-A' illustrated in FIG. 1, according to an embodiment of the present disclosure.

Referring to FIGS. 1 and 2, a sound apparatus 100 according to an embodiment of the present disclosure may include a vibration member 110 and a vibration apparatus 130.

The vibration member 110 may output sound in accordance with vibration of the vibration apparatus 130. Therefore, the vibration member 110 may be a vibration object, a vibration plate, a vibration panel, a sound plate, a sound output member, or a sound output panel, and the embodiments of the present disclosure are not limited thereto.

The vibration member 110 may be configured to be transparent, translucent, and opaque. The vibration member 110 according to an embodiment of the present disclosure may include a metal material having a material property suitable for outputting sound in accordance with vibration or may include a non-metal material (or a composite non-metal material). The metal material of the vibration member 110 according to the embodiment of the present disclosure may include at least one of stainless steel, aluminum (Al), an aluminum (Al) alloy, magnesium (Mg), a magnesium (Mg) alloy, or a magnesium lithium (Mg—Li) alloy, and the embodiments of the present disclosure are not limited thereto. The non-metal material (or the composite non-metal material) of the vibration member 110 may include at least one of glass, rubber, plastic, carbon, fiber, leather, wood, cloth, or paper, and the embodiments of the present disclosure are not limited thereto. For example, the vibration member 110 may be made of acrylonitrile-butadiene-styrene (ABS), and the embodiments of the present disclosure are not limited thereto. For example, acrylonitrile-butadiene-styrene (ABS) may be a material having impact resistance and rigidity. The vibration member may include one or more of a display panel having a pixel for displaying an image, a screen panel for projecting an image from a display device, a lighting panel, a signage panel, an interior material of a transportation means, a glass window of the transportation means, an exterior material of the transportation means, a ceiling material of a building, an interior material of the building, a glass window of the building, an interior material of an aircraft, a glass window of the aircraft, metal, wood, rubber, plastic, carbon, glass, fiber, fabric, paper, leather and mirror.

The vibration member 110 according to an embodiment of the present disclosure may implement a signage panel such as an analog signage such as an advertisement signboard, a poster, and a guide board. For example, when the vibration member 110 implements a signage panel, the analog signage may include a signage content such as a sentence, a picture, and a symbol. The signage content may be disposed at the vibration member 110 so that the signage content is visible. For example, the signage content may be attached to one or more of a first surface (or front surface) of the vibration member 110, and a second surface (or rear surface) different from (or opposite to) the first surface. For example, the signage content may be directly attached to one or more of the first surface (or the front surface) of the vibration member 110 and the second surface (or the rear surface) different from (or opposite to) the first surface. For example, the signage content may be printed on a medium such as paper, and the medium on which the signage content is printed may be attached to at least one of the first surface and the second surface of the vibration member 110. For example, the signage content may be printed on a medium such as paper, and the medium on which the signage content is printed may be directly attached to one or more of the first surface and the second surface of the vibration member 110. For example, when the signage content is attached to the second surface of the vibration member 110, the vibration member 110 may be made of a transparent material.

The vibration member 110 according to an embodiment of the present disclosure may have a planar structure. For example, the vibration member 110 may include a plate-shaped structure having a rectangular shape. The vibration member 110 may include a horizontal length parallel with a first direction X and a vertical length parallel with a second direction Y crossing the first direction X. For example, the vibration member 110 may include a rectangular shape in which a horizontal length is relatively longer than a vertical length, but the present disclosure is not limited thereto. The vibration member 110 may include a square shape in which a horizontal length and a vertical length are the same as each other.

The vibration apparatus 130 may be configured to autonomously vibrate (or displace or drive) in accordance with an applied electrical signal (or a voice signal or a sound signal), or may be configured to vibrate (or displace or drive) a vibration member (or a vibration plate or a vibration object). For example, the vibration apparatus 130 may be a vibrating structure, a vibrator, a vibration generating device, a vibration generator, a sounder, a sound device, a sound generating device, or a sound generator, but the embodiments of the present disclosure are not limited thereto.

The vibration apparatus 130 according to an embodiment of the present disclosure may include a piezoelectric material or an electroactive material having piezoelectric characteristics. The vibration apparatus 130 may vibrate (or displace or drive) the vibration member 110 in accordance with vibration (or displacement or driving) of the piezoelectric material according to an electric signal (or a voice signal or a sound signal) applied to the piezoelectric material. For example, the vibration apparatus 130 may be vibrated (or displaced or driven) as contraction and/or expansion is alternately repeated by a piezoelectric effect (or piezoelectric characteristics). For example, the vibration apparatus 130 may be vibrated (or displaced or driven) in a vertical direction (or thickness direction Z) as contraction and/or expansion is alternately repeated by a reverse piezoelectric effect.

The vibration apparatus 130 according to an embodiment of the present disclosure may be connected with or coupled to a second surface of the vibration member 110 by using an adhesive member 120. For example, the adhesive member 120 may be disposed between the vibration member 110 and the vibration apparatus 130.

The adhesive member 120 according to an embodiment of the present disclosure may include an adhesive layer (or a tacky layer) which is good in adhesive force or attaching force. For example, the adhesive member 120 may include an adhesive, a double-sided adhesive, a double-sided adhesive tape, a double-sided adhesive foam tape, a double-sided foam pad, or a tacky sheet, but embodiments of the present disclosure are not limited thereto. For example, when the adhesive member 120 includes a tacky sheet (or a tacky layer), the adhesive member 120 may include only an adhesive layer or a tacky layer without a base member such as a plastic material.

The adhesive layer (or the tacky layer) of the adhesive member 120 according to an embodiment of the present disclosure may include epoxy, acryl, silicone, or urethane, but embodiments of the present disclosure are not limited thereto.

The adhesive layer (or the tacky layer) of the adhesive member 120 according to an embodiment of the present disclosure may include a pressure sensitive adhesive (PSA), an optically clear adhesive (OCA), or an optically clear resin (OCR), but embodiments of the present disclosure are not limited thereto.

The sound apparatus 100 according to an embodiment of the present disclosure may further include an enclosure 150 and a connection member 140.

The enclosure 150 may be disposed at a rear surface of the vibration member 110 to cover the vibration member 110 and the vibration apparatus 130. The enclosure 150 has an accommodation space 150s for accommodating the vibration apparatus 130, and may include a box shape of which one side is open. In addition, the opening of one side of the accommodation space 150s may be covered by the vibration member 110, and a predetermined air gap may be formed between the accommodation space 150s and the vibration member 110.

The enclosure 150 according to an embodiment of the present disclosure may include one or more materials of a metal material or a non-metal material (or a composite non-metal material), and the embodiments of the present disclosure are not limited thereto. For example, the enclosure 150 may include one or more of metal, plastic, carbon or wood, and the embodiments of the present disclosure are not limited thereto. For example, the enclosure 150 may be a housing, a case, an outer case, a case member, a housing member, a cabinet, a sealing member, a sealing cap, a sealed box or a sound box, and the embodiments of the present disclosure are not limited thereto. For example, the accommodation space 150s of the enclosure 150 may be a gap space, an air gap, a vibration space, a sound space, a sound box or a sealed space, and the embodiments of the present disclosure are not limited thereto.

The enclosure 150 according to an embodiment of the present disclosure may uniformly maintain an impedance component due to the air that acts on the vibration member 110 when the vibration member 110 is vibrated. For example, the air around the vibration member 110 is resistant to vibration of the vibration member 110 and acts as an impedance component having resistance and reactance component, which are varied depending on frequency. Therefore, the enclosure 150 forms a sealed space surrounding the vibration apparatus 130 to uniformly maintain an impedance component (or air impedance or elastic impedance) acting on the vibration member 110 by the air, thereby improving sound characteristics and/or sound pressure characteristics of a low-pitched range generated in accordance with vibration of the vibration member 110, and improving sound quality of a high-pitched range.

The enclosure 150 according to an embodiment of the present disclosure may include a bottom portion 151 and a side portion 152.

The bottom portion 151 may be disposed at a rear surface of the vibration member 110. For example, the bottom portion 151 may be disposed on the rear surface of the vibration member 110 to cover the second surface of the vibration member 110 and the vibration apparatus 130. For example, the bottom portion 151 may be disposed to be spaced apart from the second surface of the vibration member 110 and the vibration apparatus 130. For example, the bottom portion 151 may be a plate, a bottom portion, a housing plate, or a housing bottom portion, and the embodiments of the present disclosure are not limited thereto.

The side portion 152 may be connected to an edge portion of the bottom portion 151. For example, the side portion 152 may be connected to the connection member 140. For example, the side portion 152 may be bent from the edge portion of the bottom portion 151 along a third direction Z parallel with the thickness direction of the vibration member 110. For example, the side portion 152 may include first to fourth side portions. For example, the side portion 152 may be a side, a sidewall portion, a housing side or a housing sidewall, and the embodiments of the present disclosure are not limited thereto.

The side portion 152 may be integrally formed with the bottom portion 151. For example, the bottom portion 151 and the side portion 152 may be integrally formed into one body. Therefore, an accommodation space 150s surrounded by the side portion 152 may be provided on the bottom portion 151. As a result, the bottom portion 151 and the side portion 152 may have a box shape of which one side is open.

The side portion 152 may be connected or coupled to the second surface of the vibration member 110 via the connection member 140. For example, the side portion 152 may be connected or coupled to the edge portion of the vibration member 110 via the connection member 140. For example, the side portion 152 may be connected or coupled to the edge portion of the second surface of the vibration member 110 via the connection member 140.

The connection member 140 according to an embodiment of the present disclosure may include at least one of a double-sided tape or a double-sided foam tape, and the embodiments of the present disclosure are not limited thereto.

The vibration apparatus 130 according to an embodiment of the present disclosure may be vibrated in accordance with a vibration driving signal (or sound signal) provided from a sound processing circuit to vibrate the vibration member 110, thereby generating or outputting sound.

When the vibration member 110 is configured in a planar structure, it is recognized that sound characteristics and sound pressure characteristics are deteriorated. Therefore, the inventors of the present disclosure have performed various studies and experiments to improve sound characteristics and sound pressure characteristics. The inventors of the present disclosure have invented a new sound apparatus capable of improving sound characteristics and sound pressure characteristics through various studies and experiments. This will be described below.

Figure 3:
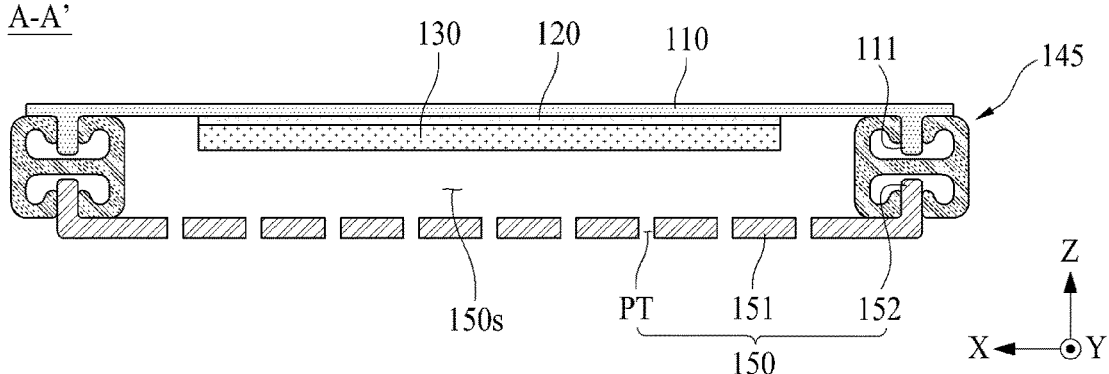
FIG. 3 is another cross-sectional view taken along line A-A' illustrated in FIG. 1 according to another embodiment of the present disclosure.
Figure 4:
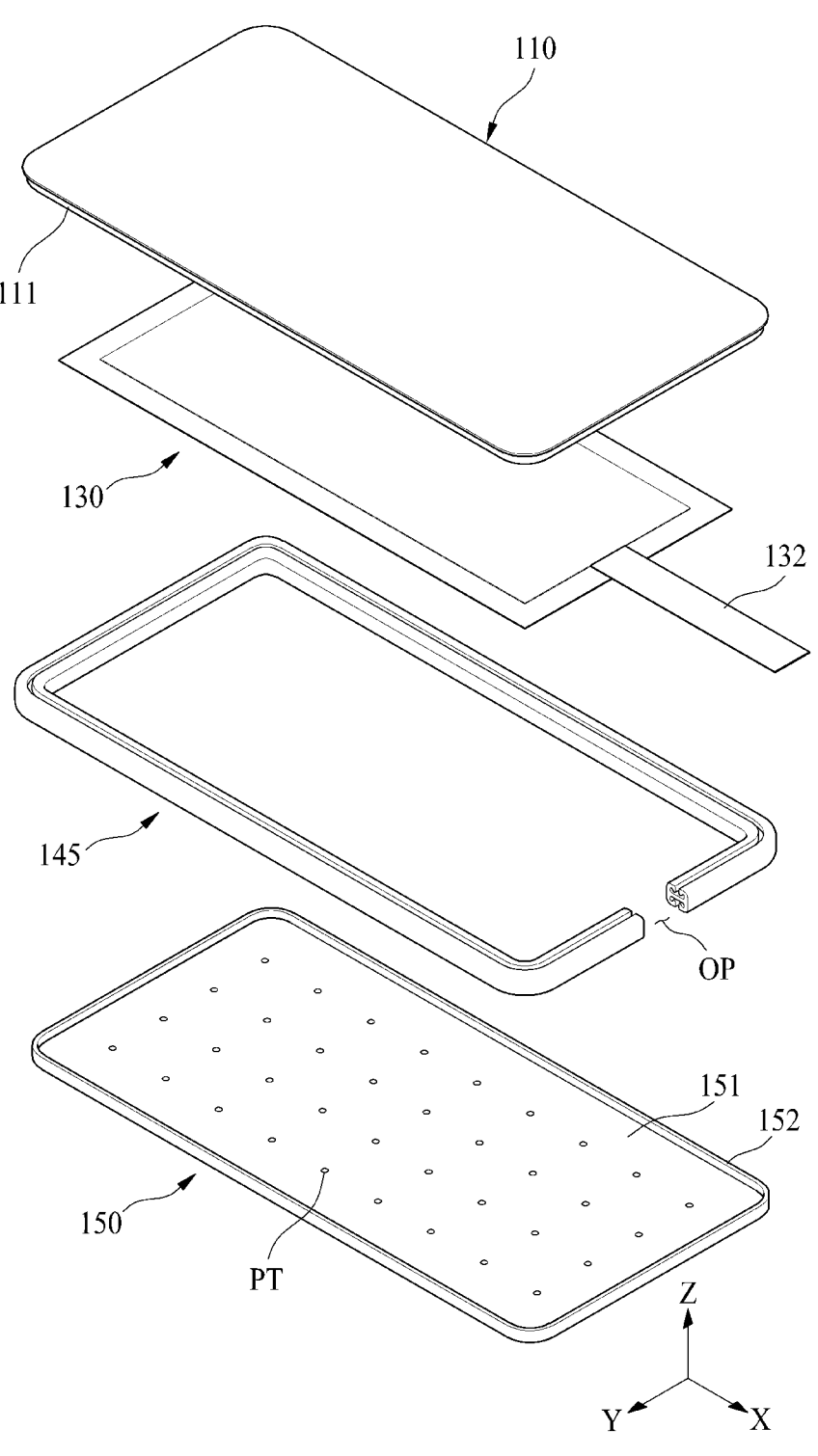
FIG. 4 is an exploded perspective view according to another embodiment of the present disclosure.
Figure 5:
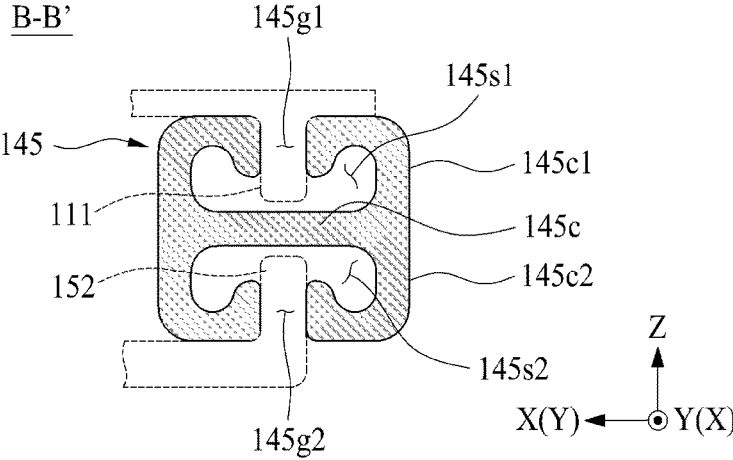
FIG. 5 is an enlarged view illustrating a connection member according to another embodiment of the present disclosure.

FIG. 3 is another cross-sectional view taken along line A-A' illustrated in FIG. 1 according to another embodiment of the present disclosure. FIG. 4 is an exploded perspective view according to another embodiment of the present disclosure. FIG. 5 is an enlarged view illustrating a connection member according to another embodiment of the present disclosure.

Referring to FIGS. 3 to 5, the sound apparatus 100 according to another embodiment of the present disclosure may include a vibration member 110 and a vibration apparatus 130. Since the vibration member 110 and the vibration apparatus 130 are substantially the same as those described with reference to FIGS. 1 and 2, their description may be omitted or simplified.

The vibration member 110 according to another embodiment of the present disclosure may be configured in a non-planar structure. For example, the vibration member 110 may include a protrusion portion 111. For example, the protrusion portion 111 may be configured at an end (or one side) of the vibration member 110. For example, the protrusion portion 111 may be protruded from the second surface of the vibration member 110. For example, the protrusion portion 111 may be formed to surround the edge of the vibration member 110. The protrusion portion 111 may be an element protruded from the rear surface of the vibration member 110. For example, the protrusion portion 111 and the vibration member 110 may be integrated into one body, and the embodiments of the present disclosure are not limited thereto.

The protrusion portion 111 may include a material of the same material as that of the vibration member 110, and the embodiments of the present disclosure are not limited thereto. The protrusion portion 111 may be a rib or the like, and the embodiments of the present disclosure are not limited thereto.

According to another embodiment of the present disclosure, since the vibration member 110 of a non-planar structure is provided, sound characteristics and/or sound pressure characteristics of the vibration apparatus 130 may be improved. For example, since the vibration member 110 of a non-planar structure is provided, sound characteristics and/or sound pressure characteristics in the high-pitched range of the vibration apparatus 130 may be improved. For example, since the protrusion portion 111 is provided in the vibration member 110, sound characteristics and/or sound pressure characteristics in the high-pitched range of the vibration apparatus 130 may be improved. For example, since the protrusion portion 111 is provided in the vibration member 110, sound characteristics and/or sound pressure characteristics at frequencies of 2 kHz to 4 kHz and/or 6 kHz may be improved.

The vibration member 110 according to another embodiment of the present disclosure may be configured to have a plurality of natural vibrations (or natural frequencies). The vibration member 110 may have a plurality of natural frequencies by including a non-planar structure. The vibration member 110 may have a plurality of different natural frequencies for each area. For example, the vibration member 110 may have a plurality of different natural frequencies in accordance with a thickness of each area of the vibration member 110.

The sound apparatus 100 according to another embodiment of the present disclosure may include an enclosure 150 and a connection member 145. Since the enclosure 150 is substantially the same as that described with reference to FIGS. 1 and 2, its description may be omitted or simplified.

The connection member according to the embodiment of the present disclosure may be disposed between the vibration member 110 and the enclosure 150. Since a physical contact (or friction) between the vibration member 110 and the enclosure 150 occurs by the connection member, a problem occurs in that a noisy sound or noise is caused by physical contact (or friction) between the vibration member 110 and the enclosure 150. Therefore, it is recognized that a peak and/or dip phenomena appears at frequencies in a middle-pitched range and/or a high-pitched range. The peak may be a phenomenon in which sound pressure is highly increased at a specific frequency. The dip may be a phenomenon in which a low sound pressure is generated by suppressing generation of a specific frequency. Sound output characteristics of the sound apparatus 100 may be degraded by the peak and/or dip phenomenon. Therefore, the inventors of the present disclosure have performed various studies and experiments capable of improving the sound output characteristics of the sound apparatus 100. A new sound apparatus capable of improving sound output characteristics of the sound apparatus 100 has been invented through various studies and experiments. The new sound apparatus will be described below.

The connection member 145 according to the embodiment of the present disclosure may absorb vibration between the vibration member 110 and the enclosure 150, and may be applied in a structure capable of widening an effective vibration area. For example, reinforcement and offset of sound waves, which are generated by the connection member between the vibration member 110 and the enclosure 150 and return without being adjusted or controlled, occur. Therefore, the peak and/or dip phenomenon occurs at a frequency in a middle-pitched range and/or a high-pitched range. Therefore, the connection member 145 according to the embodiment of the present disclosure may adjust or control the sound waves generated in the connection member between the vibration member 110 and the enclosure 150.

Referring to FIG. 5, the connection member 145 according to the embodiment of the present disclosure may be disposed between the enclosure 150 and the vibration member 110. For example, the connection member 145 disposed between the enclosure 150 and the vibration member 110 may be configured to minimize or prevent vibration of the vibration member 110 from being transferred to the enclosure 150. The connection member 145 may include a material property suitable for blocking of the vibration. For example, the connection member 145 may include a material having elasticity for vibration absorption (or impact absorption). For example, the connection member 145 may be made of a flexible material having elasticity. The connection member 145 according to the embodiment of the present disclosure may be made of polyurethane, polyolefin, or silicone, and the embodiments of the present disclosure are not limited thereto. The connection member 145 according to the embodiment of the present disclosure may include one or more of a double-sided polyurethane tape, a double-sided polyurethane foam tape, a double-sided rubber, or a double-sided sponge tape, and the embodiments of the present disclosure are not limited thereto.

The connection member 145 according to the embodiment of the present disclosure may movably support the edge of the vibration member 110. The connection member 145 may include a connecting portion. The connection portion may include a first connection portion 145*c*1 and a second connection portion 145*c*2. For example, the connection member 145 may include a first connection portion 145*c*1 supporting the edge of the vibration member 110. For example, the connection member 145 may include a second connection portion 145*c*2 supporting the edge of the vibration member 110. For example, the first connection portion 145*c*1 may be a first support, and the embodiments of the present disclosure are not limited thereto. For example, the second connection portion 145*c*2 may be a second support, and the embodiments of the present disclosure are not limited thereto.

The vibration member 110 according to the embodiment of the present disclosure may include a protrusion portion 111 connected to the connection member 145. For example, the vibration member 110 may include the first connection portion 145*c*1 and the protrusion portion 111. For example, the enclosure 150 may include the second connection portion 145*c*2 and a side portion 152. For example, the connection member 145 may be disposed between the protrusion portion 111 of the vibration member 110 and the side portion 152 of the enclosure 150. For example, the connection member 145 may connect or couple one end (or one side) of the side portion 152 of the enclosure 150 with one end (or one side) of the protrusion portion 111.

The first connection portion 145*c*1 may be connected to the vibration member 110. For example, the first connection portion 145*c*1 may be connected to the protrusion portion 111 of the vibration member 110. The second connection portion 145*c*2 may be connected to the enclosure 150. For example, the second connection portion 145*c*2 may be connected to the side portion 152 of the enclosure 150. For example, the first connection portion 145*c*1 and the second connection portion 145*c*2 may be made of an elastic material. For example, the first connection portion 145*c*1 and the second connection portion 145*c*2 may be made of a material such as silicone, rubber, or polyurethane, and the embodiments of the present disclosure are not limited thereto.

The connection member 145 according to the embodiment of the present disclosure may include an accommodation space. For example, the accommodation space may include a first accommodation space 145*s*1 and a second accommodation space 145*s*2. The connection member 145 according to the embodiment of the present disclosure may include a groove. For example, the groove may include a first groove 145*g*1 and a second groove 145*g*2.

The first connection portion 145*c*1 according to the embodiment of the present disclosure may include the first accommodation space 145*s*1. For example, the first accommodation space 145*s*1 may accommodate the protrusion portion 111. The first connection portion 145*c*1 may include the first groove 145*g*1 connected to the first accommodation space 145s1. The protrusion portion 111 may be accommodated in the first groove 145g1 of the first connection portion 145c1. For example, the first accommodation space 145s1 may be an inner space or an accommodation portion, and the embodiments of the present disclosure are not limited thereto. For example, the first groove 145g1 may be a first hole, an accommodation groove, or an accommodation hole, and the embodiments of the present disclosure are not limited thereto.

The second connection portion 145c2 according to the embodiment of the present disclosure may include the second accommodation space 145s2. For example, the second accommodation space 145s2 may accommodate the side portion 152. The second connection portion 145c2 may include the second groove 145g2 connected to the second accommodation space 145s2. The side portion 152 of the enclosure 150 may be accommodated in the second groove 145g2 of the second connection portion 145c2. For example, the second accommodation space 145s2 may be an inner space or an accommodation portion, and the embodiments of the present disclosure are not limited thereto. For example, the second groove 145g2 may be a second hole, an accommodation groove, or an accommodation hole, and the embodiments of the present disclosure are not limited thereto.

For example, the connection member 145 may include a base portion 145c. The base portion 145c may be between the first connection portion 145c1 and the second connection portion 145c2. For example, the base portion 145c may connect the first connection portion 145c1 with the second connection portion 145c2.

The connection member 145 according to another embodiment of the present disclosure may have a thickness capable of minimizing or preventing vibration of the vibration member 110 from being transferred to the enclosure 150. The connection member 145 may absorb the vibration of the vibration member 110 by its thickness and elasticity, thereby minimizing or preventing the vibration of the vibration member 110 from being transferred to the enclosure 150. In addition, the connection member 145 may prevent physical contact (or friction) between the vibration member 110 and the enclosure 150, thereby preventing noise caused by physical contact (or friction) between the vibration member 110 and the enclosure 150 from occurring. For example, the connection member 145 may be an elastic member, a flexible member, a damping member, a vibration absorbing member or a vibration blocking member, and the embodiments of the present disclosure are not limited thereto.

Referring to FIGS. 3 and 4, the enclosure 150 according to another embodiment of the present disclosure may further include one or more patterns PT. For example, the one or more patterns PT may be disposed on the bottom portion 151.

The one or more patterns PT may be placed in a predetermined area of the enclosure 150 to reduce an air pressure in a gap space inside the sound apparatus. For example, the one or more patterns may be disposed at a predetermined interval. The one or more patterns may be configured to correspond to the size of the vibration apparatus 130. The one or more patterns PT may overlap the vibration apparatus 130. For example, the one or more patterns PT may be smaller than the size of the vibration apparatus 130. For example, one or more patterns PT may be disposed differently from each other toward an area where the vibration apparatus 130 is not disposed rather than the area in which the vibration apparatus 130 is disposed. For example, the one or more patterns of the enclosure 150 may be disposed to be varied from the center toward the edge of the vibration apparatus 130. The one or more patterns PT may be disposed at the same interval, and the embodiments of the present disclosure are not limited thereto. For example, the one or more patterns PT may be formed at different intervals from the center toward the edge of the vibration apparatus 130. For example, the one or more patterns PT may be formed to have a narrow interval or a wide interval from the center toward the edge of the vibration apparatus 130. For example, the one or more patterns PT may be grooves, holes, or slits, and the embodiments of the present disclosure are not limited thereto.

According to the embodiment of the present disclosure, since the one or more patterns PT of the enclosure 150 may extend a band of the low-pitched range by reducing the air pressure in the gap space, the sound characteristics of the low-pitched range may be improved. For example, as the pressure (or the air pressure) of the gap space is lowered by the one or more patterns PT, the amount of displacement (or bending force) of the vibration apparatus 130 disposed between the vibration member 110 and the enclosure 150 may be increased, whereby the band of the low-pitched range may be extended, and the sound characteristics and/or the sound pressure characteristics of the low-pitched range may be improved. When the one or more patterns PT are not disposed in the enclosure 150, the sound waves or sound generated by the vibration of the vibration apparatus 130 increases the air pressure in the gap space, and thus the sound characteristics of the low-pitched range may be degraded.

According to the embodiment of the present disclosure, since the one or more patterns PT are provided in the enclosure 150, the air may be discharged through the one or more patterns PT even though the sound waves or sound is generated by the vibration of the vibration apparatus 130, whereby the air pressure in the gap space may be lowered. Therefore, since the band of the low-pitched range may be extended, the sound characteristics of the low-pitched range may be improved.

Referring to FIG. 4, the connection member 145 according to the embodiment of the present disclosure may include an opening OP. A signal cable 132 may pass through the opening OP. The connection member 145 of the remaining portion except the opening OP in the portion between the vibration member 110 and the enclosure 150 may be sealed.

The vibration apparatus 130 according to the embodiment of the present disclosure may be vibrated in accordance with the vibration driving signal (or sound signal) provided from the sound processing circuit to vibrate the vibration member 110, thereby generating or outputting sound. The sound generated in accordance with the vibration of the vibration member 110 having a non-planar structure may increase sound pressure characteristics and extend a reproduction pitched range by vibration having various natural frequencies of the vibration member 110.

The vibration member 110 of the sound apparatus 100 according to the embodiment of the present disclosure may further include a protrusion portion 111 to improve sound output characteristics, improve the peak and/or dip phenomenon and more improve sound characteristics. The peak may be a phenomenon in which sound pressure is highly increased at a specific frequency. The dip may be a phenomenon in which a low sound pressure is generated by suppressing generation of a specific frequency. Sound output characteristics of the sound apparatus 100 may be degraded by the peak and/or dip phenomenon. According to another embodiment of the present disclosure, since the protrusion portion 111 is provided in the vibration member 110, the peak and/or dip phenomenon in a high-pitched range may be reduced so that sound characteristics and/or sound pressure characteristics in the high-pitched range may be further improved. The low-pitched range may be in a frequency range of 500 Hz or less, the middle-pitched range may be a frequency range of 500 Hz to 2 kHz, and the high-pitched range may be in a frequency range of 2 kHz to 20 kHz. The frequency ranges of the low-pitched range, the middle-pitched range and the high-pitched range do not limit the present disclosure.

The connection member 145 according to the embodiment of the present disclosure may absorb vibration of the vibration member 110 to minimize or prevent the vibration of the vibration member 110 from being transferred to the enclosure 150. The connection member 145 according to the embodiment of the present disclosure may absorb the vibration between the vibration member 110 and the enclosure 150, and may widen an effective vibration area, whereby the peak and/or dip phenomenon at the frequency in the middle/low-pitched range and/or the high-pitched range may be minimized or prevented. Since the connection member 145 according to the embodiment of the present disclosure is supported to be movable at the edge of the vibration member 110, the peak and/or dip phenomenon at the frequency in the middle/low-pitched range and/or the high-pitched range may be minimized or prevented.

Figure 6:
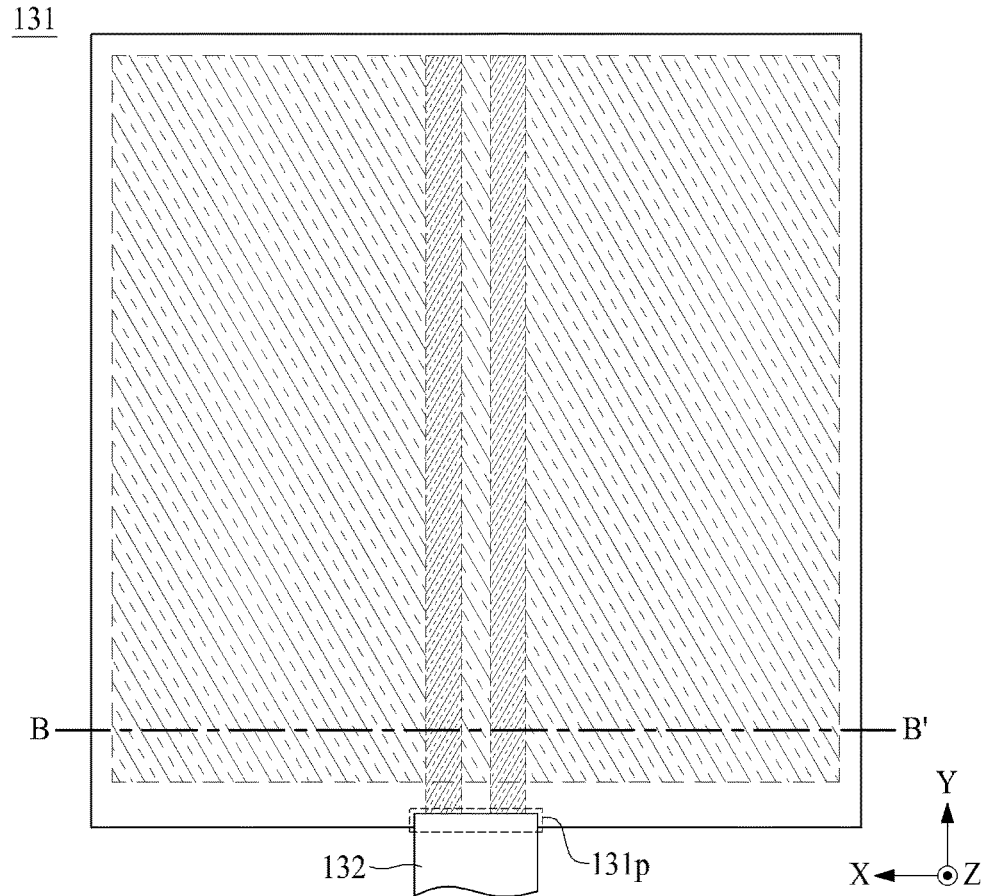
FIG. 6 illustrates a vibration device according to an embodiment of the present disclosure.
Figure 7:
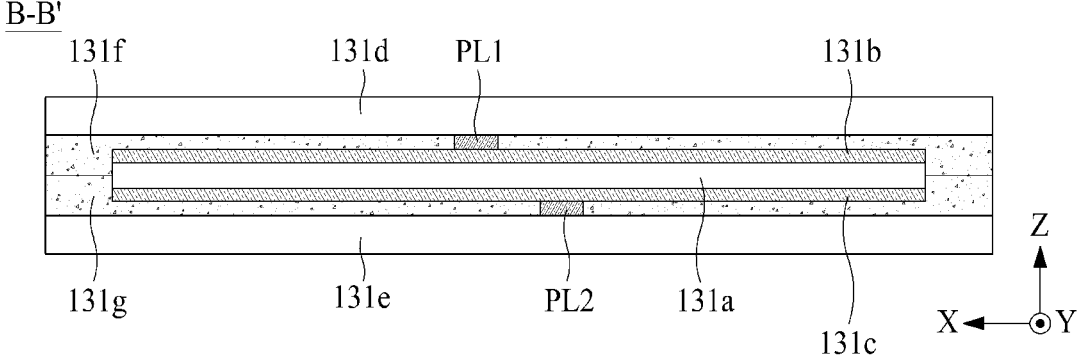
FIG. 7 is a cross-sectional view taken along line B-B' illustrated in FIG. 6, according to an embodiment of the present disclosure.

FIG. 6 illustrates a vibration device according to an embodiment of the present disclosure. FIG. 7 is a cross-sectional view taken along line B-B' illustrated in FIG. 6, according to an embodiment of the present disclosure.

Referring to FIGS. 6 and 7, the vibration apparatus 130 according to an embodiment of the present disclosure may include one or more vibration devices 131.

The one or more vibration devices 131 according to an embodiment of the present disclosure may include a rectangular shape having a first length parallel with the first direction X and a second length parallel with the second direction Y crossing the first direction X. For example, the one or more vibration devices 131 may include a square shape of which a first length and a second length are the same as each other, but the present disclosure is not limited thereto. The one or more vibration devices 131 may include a rectangular shape, a non-rectangular shape, a circular shape or an elliptical shape, in which any one of the first length and the second length is longer than the other one.

The vibration device 131 according to an embodiment of the present disclosure may include a vibration portion 131$a$, a first electrode portion 131$b$, and a second electrode portion 131$c$.

The vibration portion 131$a$ may include a piezoelectric material (or an electroactive material) having a piezoelectric effect. For example, the piezoelectric material may have a characteristic where pressure or twisting is applied to a crystalline structure by an external force, a potential difference occurs due to dielectric polarization (or poling) caused by a relative position change of a positive (+) ion and a negative (−) ion, and a vibration is generated by an electric field based on a voltage applied thereto. The vibration portion 131$a$ may be referred to as the terms such as a piezoelectric layer, a piezoelectric material layer, an electroactive layer, a vibration portion, a piezoelectric material portion, an electroactive portion, a piezoelectric structure, a piezoelectric composite layer, a piezoelectric composite, or a piezoelectric ceramic composite, but the terms are not limited thereto. The vibration portion 131$a$ may include a transparent conductive material, a semitransparent conductive material, or an opaque conductive material and may be transparent, semitransparent, or opaque.

The vibration portion 131$a$ may include an inorganic material portion. The inorganic material portion may include a piezoelectric material, a composite piezoelectric material, or an electroactive material, which has a piezoelectric effect, but embodiments of the present disclosure are not limited thereto.

The vibration portion 131$a$ according to an embodiment of the present disclosure may include a ceramic-based material for generating a relatively strong vibration, or may include a piezoelectric ceramic having a perovskite-based crystalline structure. The perovskite crystalline structure may have a piezoelectric effect and/or an inverse piezoelectric effect, and may be a plate-shaped structure having orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A" and "B" may be cations, and "O" may be anions. For example, the first portions 131$a$1 may include one or more of lead (II) titanate (Pb-$TiO_3$), lead zirconate (Pb$ZrO_3$), lead zirconate titanate (PbZr$TiO_3$), barium titanate (Ba$TiO_3$), and strontium titanate (Sr$TiO_3$), but embodiments of the present disclosure are not limited thereto.

The piezoelectric ceramic may be made of a single crystal ceramic having a single crystal structure, or may be made of a ceramic material or a polycrystalline ceramic, which has a polycrystalline structure. The piezoelectric material of the single crystal ceramic may include $\alpha$-$AlPO_4$, $\alpha$-$SiO_2$, $LiNbO_3$, $Tb_2(MoO_4)_3$, $Li_2B_4O_7$, or $ZnO$, and the embodiments of the present disclosure are not limited thereto. The piezoelectric material of the polycrystalline ceramic may include a lead zirconate titanate (PZT)-based material containing lead (Pb), zirconium (Zr) and titanium (Ti), or a lead zirconate nickel niobate (PZNN)-based material containing lead (Pb), zirconium (Zr), nickel (Ni) and niobium (Nb), and the embodiments of the present disclosure are not limited thereto.

As another example, the vibration portion 131$a$ may include at least one of $CaTiO_3$, $BaTiO_3$, or $SrTiO_3$, which does not include lead (Pb), and the embodiments of the present disclosure are not limited thereto.

The first electrode portion 131$b$ may be disposed on a first surface (or an upper surface) of the vibration portion 131$a$. The first electrode portion 131$b$ may be disposed at or coupled (or connected) to a first surface of each of the plurality of first portions 131$a$1 and a first surface of each of the plurality of second portions 131$a$2 in common and may be electrically connected with the first surface of each of the plurality of first portions 131$a$1. For example, the first electrode portion 131$b$ may have a single electrode (or one electrode) shape disposed at the whole first surface of the vibration portion 131$a$. For example, the first electrode portion 131$b$ may have substantially the same shape as that of the vibration portion 131$a$, but embodiments of the present disclosure are not limited thereto.

The first electrode portion 131$b$ according to an embodiment of the present disclosure may be made of a transparent conductive material, a translucent conductive material, or an opaque conductive material. For example, the transparent or translucent conductive material may include indium tin oxide (ITO) or indium zinc oxide (IZO), and the embodiments of the present disclosure are not limited thereto. The opaque conductive material may include gold (Au), silver (Ag), platinum (Pt), palladium (Pd), molybdenum (Mo), magnesium (Mg), carbon or silver (Ag) containing glass frit, or their alloy, and the embodiments of the present disclosure are not limited thereto. For example, the first electrode portion 131b may include silver (Ag) having low specific resistance in order to improve electrical characteristics and/or vibration characteristics of the vibration portion 131a. For example, the carbon may be a carbon material containing carbon black, ketjen black, carbon nanotubes, and graphite, and the embodiments of the present disclosure are not limited thereto.

The second electrode portion 131c may be disposed on a second surface (or rear surface) different from (or opposite to) a first surface of the vibration portion 131a. The second electrode portion 131c may be commonly disposed on or coupled to a second surface of each of a plurality of first portions 131a1 and a second surface of each of a plurality of second portions 131a2, and may be electrically connected to the second surface of each of the plurality of first portions 131a1. For example, the second electrode portion 131c may have a cylindrical electrode shape disposed on the entire second surface of the vibration portion 131a. For example, the second electrode portion 131c may have the same shape as that of the vibration portion 131a, and the embodiments of the present disclosure are not limited thereto. The second electrode portion 131c according to an embodiment of the present disclosure may be made of a transparent conductive material, a translucent conductive material, or an opaque conductive material. For example, the second electrode portion 131c may be made of the same material as that of the first electrode portion 131b, and the embodiments of the present disclosure are not limited thereto. As another example, the second electrode portion 131c may be formed of a material different from that of the first electrode portion 131b.

The vibration portion 131a may be polarized (or poling) by a constant voltage applied to the first electrode portion 131b and the second electrode portion 131c in the atmosphere of a constant temperature or a temperature which changes from a high temperature to a room temperature, and the embodiments of the present disclosure are not limited thereto. For example, the vibration portion 131a may be vibrated by alternately repeating contraction and/or expansion by a reverse piezoelectric effect according to a sound signal (or voice signal) applied to the first electrode portion 131b and the second electrode portion 131c from the outside. For example, the vibration portion 131a may be vibrated by vibration in a vertical direction and vibration in a plane direction by the first electrode portion 131b and the second electrode portion 131c. The displacement (or vibration or driving) of the vibration member (or the vibration plate or the vibration object) may be increased by contraction and/or expansion in the plane direction of the vibration portion 131a, whereby vibration characteristics of the vibration device may be further improved.

The vibration device 131 according to an embodiment of the present disclosure may further include a first cover member 131d and a second cover member 131e.

The first cover member 131d may be disposed on a first surface of the vibration device 131. For example, the first cover member 131d may be configured to cover the first electrode portion 131b. Accordingly, the first cover member 131d may protect the first electrode portion 131b.

The second cover member 131e may be disposed on a second surface of the vibration device 131. For example, the second cover member 131e may be configured to cover the second electrode portion 131c. Accordingly, the second cover member 131e may protect the second electrode portion 131c.

Each of the first cover member 131d and the second cover member 131e according to an embodiment of the present disclosure may include one or more materials of plastic, fiber, carbon, and wood, but embodiments of the present disclosure are not limited thereto. For example, the first cover member 131d and the second cover member 131e may include the same material or different materials. For example, the first cover member 131d and the second cover member 131e may be a polyimide film or a polyethylene terephthalate film, but embodiments of the present disclosure are not limited thereto.

The first cover member 131d according to an embodiment of the present disclosure may be connected or coupled to the first electrode portion 131b by using a first adhesive layer 131f. For example, the first cover member 131d may be connected or coupled to the first electrode portion 131b through a film laminating process using the first adhesive layer 131f.

The second cover member 131e according to an embodiment of the present disclosure may be connected or coupled to the second electrode portion 131c by using a second adhesive layer 131g. For example, the second cover member 131e may be connected or coupled to the second electrode portion 131c through a film laminating process using the second adhesive layer 131g.

The first adhesive layer 131f may be disposed between the first electrode portion 131b and the first cover member 131d. The second adhesive layer 131g may be disposed between the second electrode portion 131c and the second cover member 131e. For example, the first adhesive layer 131f and the second adhesive layer 131g may be provided between the first cover member 131d and the second cover member 131e to surround the vibration portion 131a, the first electrode portion 131b, and the second electrode portion 131c. For example, the first adhesive layer 131f and the second adhesive layer 131g may be provided between the first cover member 131d and the second cover member 131e to fully surround the vibration portion 131a, the first electrode portion 131b, and the second electrode portion 131c. For example, the vibration portion 131a, the first electrode portion 131b, and the second electrode portion 131c may be buried or embedded between the first adhesive layer 131f and the second adhesive layer 131g.

Each of the first adhesive layer 131f and the second adhesive layer 131g according to an embodiment of the present disclosure may include an electrical insulation material which has adhesive properties and is capable of compression and decompression. For example, each of the first adhesive layer 131f and the second adhesive layer 131g may include epoxy resin, acrylic resin, silicone resin, and urethane resin, but embodiments of the present disclosure are not limited thereto.

Any one of a first cover member 131d and a second cover member 131e may be attached or coupled (or connected) to the vibration member (or a vibration plate or a vibration object) via an adhesive member.

According to an embodiment of the present disclosure, any one of the first cover member 131d and the second cover member 131e may be attached to or coupled to (or connected to) the vibration member (or the vibration plate or the vibration object) via an adhesive member. For example, any one of the first cover member 131d and the second cover member 131e may be attached to or coupled to (or connected to) the vibration member 110 via an adhesive member 120 as described with reference to FIGS. 1 and 2.

The vibration device 131 according to an embodiment of the present disclosure may further include a first power supply line PL1, a second power supply line PL2, and a pad portion 131*p*.

The first power supply line PL1 may be disposed on the first cover member 131*d*. For example, the first power supply line PL1 may be disposed between the first electrode portion 131*b* and the first cover member 131*d*, and may be electrically connected to the first electrode portion 131*b*. The first power supply line PL1 may be elongated along the second direction Y, and may be electrically connected to a central portion of the first electrode portion 131*b*. In an embodiment, the first power supply line PL1 may be electrically connected to the first electrode portion 131*b* via an anisotropic conductive film. In another embodiment, the first power supply line PL1 may be electrically connected to the first electrode portion 131*b* through a conductive material (or particles) contained in a first adhesive layer 131*f*.

The second power supply line PL2 may be disposed on the second cover member 131*e*. For example, the second power supply line PL2 may be disposed between the second electrode portion 131*c* and the second cover member 131*e*, and may be electrically connected to the second electrode portion 131*c*. The second power supply line PL2 may be elongated along the second direction Y, and may be electrically connected to a central portion of the second electrode portion 131*c*. In an embodiment, the second power supply line PL2 may be electrically connected to the second electrode portion 131*c* via an anisotropic conductive film. In another embodiment, the second power supply line PL2 may be electrically connected to the second electrode portion 131*c* through a conductive material (or particles) contained in a second adhesive layer 131*g*.

According to an embodiment of the present disclosure, a first power supply line PL1 and a second power supply line PL2 may be disposed not to overlap each other. When the first power supply line PL1 is disposed not to overlap the second power supply line PL2, a problem of a short circuit defect between the first power supply line PL1 and the second power supply line PL2 may be solved.

The pad portion 131*p* may be electrically connected to the first power supply line PL1 and the second power supply line PL2. For example, the pad portion 131*p* may be formed at one edge portion of one of the first cover member 131*d* and the second cover member 131*e* so that the pad portion 131*p* may be electrically connected to one side (or one end) of each of the first power supply line PL1 and the second power supply line PL2.

The pad portion 131*p* according to an embodiment of the present disclosure may include a first pad electrode electrically connected to one end (or one side) of the first power supply line PL1 and a second pad electrode electrically connected to one end (or one side) of the second power supply line PL2.

The first pad electrode may be disposed at one edge portion of one of the first cover member 131*d* and the second cover member 131*e* and may be connected to one end of the first power supply line PL1. For example, the first pad electrode may pass through one of the first cover member 131*d* and the second cover member 131*e* and may be electrically connected to one end of the first power supply line PL1.

The second pad electrode may be disposed in parallel with the first pad electrode and may be connected to one end of the second power supply line PL2. For example, the second pad electrode may pass through one of the first cover member 131*d* and the second cover member 131*e* and may be electrically connected to one end of the second power supply line PL2.

According to an embodiment of the present disclosure, each of the first power supply line PL1, the second power supply line PL2, and the pad portion 131*p* may be configured to be transparent, semitransparent, or opaque.

A pad portion 131*p* according to an embodiment of the present disclosure may be electrically connected with a signal cable 132.

The signal cable 132 may be electrically connected with the pad portion 131*p* disposed in the vibration device 131 and may supply the vibration device 131 with a vibration driving signal (or a sound signal or a voice signal) provided from a sound processing circuit. The signal cable 132 according to an embodiment of the present disclosure may include a first terminal electrically connected with a first pad electrode of the pad portion 131*p* and a second terminal electrically connected with a second pad electrode of the pad portion 131*p*. For example, the signal cable 132 may be configured as a flexible printed circuit cable, a flexible flat cable, a single-sided flexible printed circuit, a single-sided flexible printed circuit board (PCB), a flexible multi-layer printed circuit, or a flexible multi-layer PCB, but embodiments of the present disclosure are not limited thereto.

The sound processing circuit may generate an alternating current (AC) vibration driving signal including a first vibration driving signal and a second vibration driving signal on the basis of sound data provided from an external sound data generating circuit. The first vibration driving signal may be one of a positive (+) vibration driving signal and a negative (−) vibration driving signal, and the second vibration driving signal may be one of the positive (+) vibration driving signal and the negative (−) vibration driving signal. For example, the first vibration driving signal may be supplied to the first electrode portion 131*b* through the first terminal of the signal cable 132, the first pad electrode of the pad portion 131*p*, and the first power supply line PL1. The second vibration driving signal may be supplied to the second electrode portion 131*c* through the second terminal of the signal cable 132, the second pad electrode of the pad portion 131*p*, and the second power supply line PL2.

According to an embodiment, the signal cable 132 may be configured to be transparent, semitransparent, or opaque.

The vibration device 131 according to an embodiment of the present disclosure may be implemented in the form of a thin film by alternately and repeatedly connecting the first portion 131*a*1 having piezoelectric characteristics with the second portion 131*a*2 having flexibility. Therefore, the vibration device 131 may be bent in a shape corresponding to that of the vibration member or the vibration object. For example, when the vibration device 131 is connected to or coupled to the vibration member including various curved portions via the adhesive member 120, the vibration device 131 may be bent in a curved shape along the shape of the curved portion of the vibration member 110, and reliability of damage or breakage is not degraded even though the vibration device is bent in a curved shape.

Figure 8:
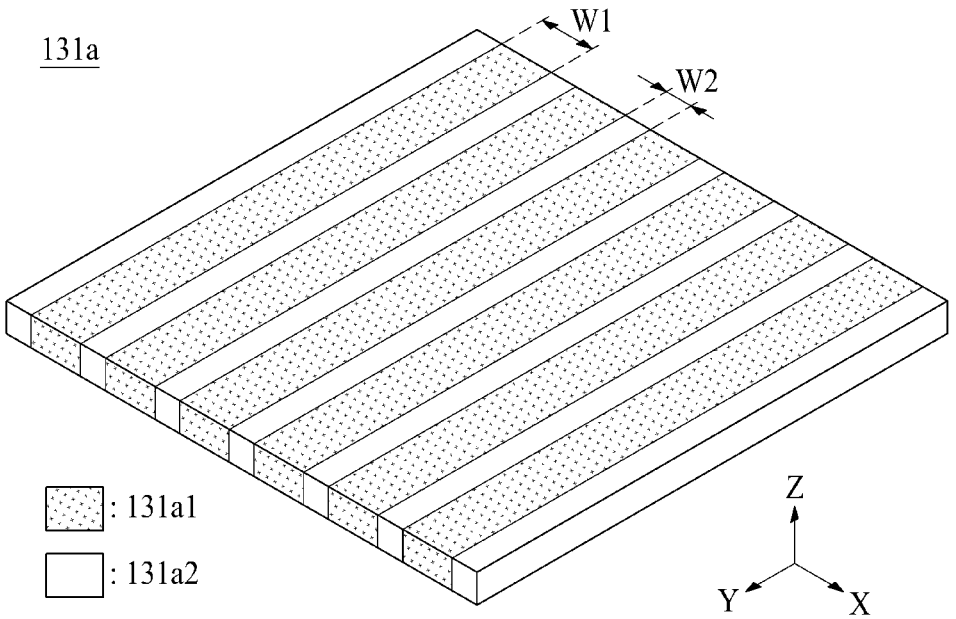
FIG. 8 is a perspective view illustrating a vibration portion according to another embodiment of the present disclosure.

FIG. 8 is a perspective view illustrating a vibration portion according to another embodiment of the present disclosure.

The vibration portion 131*a* according to an embodiment of the present disclosure may include a plurality of first portions 131*a*1 and a plurality of second portions 131*a*2. For example, the plurality of first portions 131*a*1 and the plurality of second portions 131*a*2 may be alternately and repeatedly disposed along the first direction X (or the second direction Y). For example, the first direction X may be a horizontal direction of the vibration portion 131*a*, and the second direction Y may be a vertical direction of the vibration portion 131*a* crossing the first direction X, and the embodiments of the present disclosure are not limited thereto. For example, the first direction X may be a vertical direction of the vibration portion 131*a*, and the second direction Y may be a horizontal direction of the vibration portion 131*a*.

One or more vibration devices 131 according to another embodiment of the present disclosure may be configured to have flexibility. For example, the one or more vibration devices 131 may be configured to be bent in a non-planar shape including a curved surface. Therefore, the one or more vibration devices 131 according to an embodiment of the present disclosure may be a flexible vibration structure, a flexible vibrator, a flexible vibration generating element, a flexible vibration generator, a flexible sound apparatus, a flexible sound element, a flexible sound generating element, a flexible sound generator, a flexible actuator, a flexible speaker, a flexible piezoelectric speaker, a film actuator, a film-type piezoelectric composite actuator, a film speaker, a film-type piezoelectric speaker, or a film-type piezoelectric composite speaker, and the embodiments of the present disclosure are not limited thereto Each of the plurality of first portions 131*a*1 may include an inorganic material portion. The inorganic material portion may include a piezoelectric material, a composite piezoelectric material, or an electroactive material, which has a piezoelectric effect, but embodiments of the present disclosure are not limited thereto.

Each of the plurality of first portions 131*a*1 may include a ceramic-based material for generating a relatively strong vibration, or may include a piezoelectric ceramic having a perovskite-based crystalline structure. The perovskite crystalline structure may have a piezoelectric effect and/or an inverse piezoelectric effect, and may be a plate-shaped structure having orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A" and "B" may be cations, and "O" may be anions. For example, the first portions 131*a*1 may include one or more of lead (II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but embodiments of the present disclosure are not limited thereto.

The piezoelectric ceramic may be made of a single crystal ceramic having a single crystal structure, or may be made of a ceramic material or a polycrystalline ceramic, which has a polycrystalline structure. The piezoelectric material of the single crystal ceramic may include $\alpha$-$AlPO_4$, $\alpha$-$SiO_2$, $LiNbO_3$, $Tb_2(MoO_4)_3$, $Li_2B_4O_7$, or ZnO, and the embodiments of the present disclosure are not limited thereto. The piezoelectric material of the polycrystalline ceramic may include a lead zirconate titanate (PZT)-based material containing lead (Pb), zirconium (Zr) and titanium (Ti), or a lead zirconate nickel niobate (PZNN)-based material containing lead (Pb), zirconium (Zr), nickel (Ni) and niobium (Nb), but the embodiments of the present disclosure are not limited thereto.

As another example, the vibration portion 131*a* may include at least one of $CaTiO_3$, $BaTiO_3$, or $SrTiO_3$, which does not include lead (Pb), and the embodiments of the present disclosure are not limited thereto.

Each of the plurality of first portions 131*a*1 according to an embodiment of the present disclosure may be disposed between two adjacent second portions 131*a*2 of the plurality of second portions 131*a*2, and moreover, may have a first width W1 parallel to the first direction X (or the second direction Y) and may have a length parallel to the second direction Y (or the first direction X). Each of the plurality of second portions 131*a*2 may have a second width W2 parallel to the first direction X (or the second direction Y) and may have a length parallel to the second direction Y (or the first direction X). The first width W1 may be the same as or different from the second width W2. For example, the first width W1 may be greater than the second width W2. For example, the first portion 131*a*1 and the second portion 131*a*2 may include a line shape or a stripe shape having the same size or different sizes. Accordingly, the vibration portion 131*a* may have a 2-2 composite structure having a piezoelectric characteristic of a 2-2 vibration mode, and thus, may have a resonance frequency of 20 kHz or less, but embodiments of the present disclosure are not limited thereto. For example, the resonance frequency of the vibration portion 131*a* may vary based on one or more of a shape, a length, and a thickness.

In the vibration portion 131*a*, the plurality of first portions 131*a*1 and the plurality of second portions 131*a*2 may be disposed (or arranged) in parallel on the same plane (or the same layer). Each of the plurality of second portions 131*a*2 may be configured to fill a gap between two adjacent first portions 131*a*1, and thus, each of the plurality of second portions 131*a*2 may be connected to or attached on an adjacent first portion 131*a*1. Accordingly, the vibration portion 131*a* may extend by a desired size or length based on lateral coupling (or connection) of the first portion 131*a*1 and the second portion 131*a*2.

In the vibration portion 131*a*, the width W2 of each of the plurality of second portions 131*a*2 may decrease progressively in a direction from a center portion of the vibration portion 131*a* or the vibration device 131 to both edge portions (or both ends) thereof.

According to an embodiment of the present disclosure, when the vibration portion 131*a* or the vibration device 131 vibrates in an upward and downward direction Z (or a thickness direction), a second portion 131*a*2 having a largest width W2 among the plurality of second portions 131*a*2 may be disposed at a portion on which largest stress concentrates. When the vibration portion 131*a* or the vibration device 131 vibrates in the upward and downward direction Z, a second portion 131*a*2 having a smallest width W2 among the plurality of second portions 131*a*2 may be disposed at a portion where a relatively smallest stress occurs. For example, the second portion 131*a*2 having the largest width W2 among the plurality of second portions 131*a*2 may be disposed at a center portion of the vibration portion 131*a*, and the second portion 131*a*2 having the smallest width W2 among the plurality of second portions 131*a*2 may be disposed at both edge portions of the vibration portion 131*a*. Accordingly, when the vibration portion 131*a* or the vibration device 131 vibrates in the upward and downward direction Z, an overlap of a resonance frequency or interference of a sound wave generated in a portion on which a largest stress concentrates may be minimized, and thus, the dipping of a sound pressure level generated in a low pitched sound band may decrease and the flatness of a sound characteristic of the low pitched sound band may be improved. For example, the flatness of a sound characteristic may be a magnitude of a deviation between a highest sound pressure level and a lowest sound pressure level.

In the vibration portion 131a, the plurality of first portions 131a1 may have different sizes (or widths). For example, a size (or a width) of each of the plurality of first portions 131a1 may decrease or increase progressively in a direction from the center portion of the vibration portion 131a or the vibration device 131 to both edge portions (or both ends) thereof. Therefore, a sound pressure level characteristic of a sound of the vibration portion 131a may be enhanced by various natural vibration frequencies based on vibrations of the plurality of first portions 131a1 having different sizes, and a reproduction band of a sound may extend.

Each of the plurality of second portions 131a2 may be disposed between the plurality of first portions 131a1. Therefore, in the vibration portion 131a or the vibration device 131, vibration energy based on a link in a unit lattice of the first portion 131a1 may be increased by the second portion 131a2, and thus, a vibration characteristic may increase, and a piezoelectric characteristic and flexibility may be secured. For example, the second portion 131a2 may include one of an epoxy-based polymer, an acrylic-based polymer, and a silicone-based polymer, but embodiments of the present disclosure are not limited thereto.

Each of the plurality of second portions 131a2 according to an embodiment of the present disclosure may include an organic material portion. For example, each of the organic material portions may be disposed between two adjacent inorganic material portions of the plurality of inorganic material portions, and thus, may absorb an impact applied to a corresponding inorganic material portion (or a first portion), a stress concentrating on the inorganic material portion may be released to enhance the durability of the vibration portion 131a or the vibration device 131, and flexibility may be provided to the vibration portion 131a or the vibration device 131. Accordingly, the vibration device 131 may be configured to have flexibility.

The second portion 131a2 according to an embodiment may have modulus (or young's modulus) and viscoelasticity which are lower than those of the first portion 131a1, and thus, may enhance the reliability of the first portion 131a1 which is vulnerable to an impact due to a fragile characteristic thereof. For example, the second portion 131a2 may include a material which has a loss coefficient of 0.01 to 1 and a modulus of 0.1 GPa to 10 GPa (Gigapascal).

The organic material portion included in the second portion 131a2 may include an organic material, an organic polymer, an organic piezoelectric material, or an organic non-piezoelectric material having a flexible characteristic compared to the inorganic material portion which is the first portion 131a1. For example, the second portion 131a2 may be referred to as an adhesive portion, a flexible portion, a bending portion, a damping portion, or a ductile portion, or the like, but embodiments of the present disclosure are not limited thereto.

The vibration portion 131a according to an embodiment of the present disclosure may have a single thin film type as the plurality of first portions 131a1 and the second portion 131a2 are disposed (or connected) on the same plane. For example, the plurality of first portions 131a1 of the vibration portion 131a may be connected to one side. For example, the plurality of first portions 131a1 may have a structure connected to the entire vibration portion 131a. For example, the vibration portion 131a may be vibrated in a vertical direction based on the vibration member 110 by the first portion 131a1 having vibration characteristics, and may be bent in a curved shape by the second portion 131a2 having flexibility. In addition, in the vibration portion 131a according to an embodiment of the present disclosure, a size of the first portion 131a1 and a size of the second portion 131a2 may be set in accordance with piezoelectric characteristics and flexibility, which are required for the vibration portion 131a or the vibration device 131. As an example, in case of the vibration portion 131a that requires piezoelectric characteristics rather than flexibility, the size of the first portion 131a1 may be larger than that of the second portion 131a2. As another example, in case of the vibration portion 131a that requires flexibility rather than piezoelectric characteristics, the size of the second portion 131a2 may be larger than that of the first portion 131a1. Therefore, since the size of the vibration portion 131a may be adjusted in accordance with the required characteristics, the vibration portion 131a may be easily designed.

With reference to FIG. 8, a vibration portion 131a according to another embodiment of the present disclosure may include a plurality of first portions 131a1, which are apart from one another in a first direction X and a second direction Y, and a second portion 131a2 disposed between the plurality of first portions 131a1.

The plurality of first portions 131a1 may be arranged apart from one another in each of the first direction X and the second direction Y. For example, the plurality of first portions 131a1 may be arranged in a lattice form to have a hexahedral shape having the same size. Each of the plurality of first portions 131a1 may include substantially the same piezoelectric material as that of the first portion 131a1 described above with reference to FIG. 7, and thus, like reference numerals refer to like elements and repeated descriptions thereof are omitted.

The second portion 131a2 may be arranged between the plurality of first portions 131a1 in each of the first direction X and the second direction Y. The second portion 131a2 may be configured to fill a gap between two adjacent first portions 131a1 or surround each of the plurality of first portions 131a1, and thus, may be connected or adhered to an adjacent first portion 131a1. According to an embodiment of the present disclosure, a width of the second portion 131a2 disposed between two first portions 131a1 adjacent to each other in the first direction X may be the same as or different from that of the first portion 131a1, and a width of the second portion 131a2 disposed between two first portions 131a1 adjacent to each other in the second direction Y may be the same as or different from that of the first portion 131a1. The second portion 131a2 may include substantially the same piezoelectric material as that of the second portion 131a2 described above with reference to FIG. 7, and thus, like reference numerals refer to like elements and repeated descriptions thereof are omitted.

The vibration portion 131a according to another embodiment of the present disclosure may have a 1-3 composite structure having a piezoelectric characteristic of a 1-3 vibration mode, and thus, may have a resonance frequency of 30 MHz or less, but embodiments of the present disclosure are not limited thereto. For example, the resonance frequency of the vibration portion 131a may vary based on one or more of a shape, a length, and a thickness.

Each of the plurality of first portions 131a1 of the vibration portion 131a according to another embodiment of the present disclosure may have a circular planar structure. For example, each of the plurality of first portions 131a1 may have a disk shape, and the embodiments of the present disclosure are not limited thereto. For example, each of the plurality of first portions 131a1 may have a point shape including an oval shape, a polygonal shape, or a donut shape. The vibration portion 131a may include the plurality of first portions 131a1 spaced apart from each other along the first direction X and the second direction Y and the second portion 131a2 disposed between the plurality of first portions 131a1.

Each of the plurality of first portions 131a1 of the vibration portion 131a according to another embodiment of the present disclosure may have a triangular planar structure. For example, each of the plurality of first portions 131a1 may have a triangular plate shape.

According to another embodiment of the present disclosure, four adjacent first portions 131a1 of the plurality of first portions 131a1 may be disposed to be adjacent to one another to form a rectangular shape (or square shape). A vertex of each of the four adjacent first portions 131a1 forming a rectangular shape may be disposed to be adjacent to a central portion of the rectangular shape.

Each of the plurality of first portions 131a1 of the vibration portion 131a according to another embodiment of the present disclosure may have a hexagonal planar structure. For example, each of the plurality of first portions 131a1 may have a hexagonal plate shape.

According to another embodiment of the present disclosure, six adjacent first portions 131a1 of the plurality of first portions 131a1 may be disposed to be adjacent to one another to form a hexagonal shape (or a regular hexagonal shape). A vertex of each of the six adjacent first portions 131a1 forming a hexagonal shape may be disposed to be adjacent to the central portion of the hexagonal shape.

Figure 9:
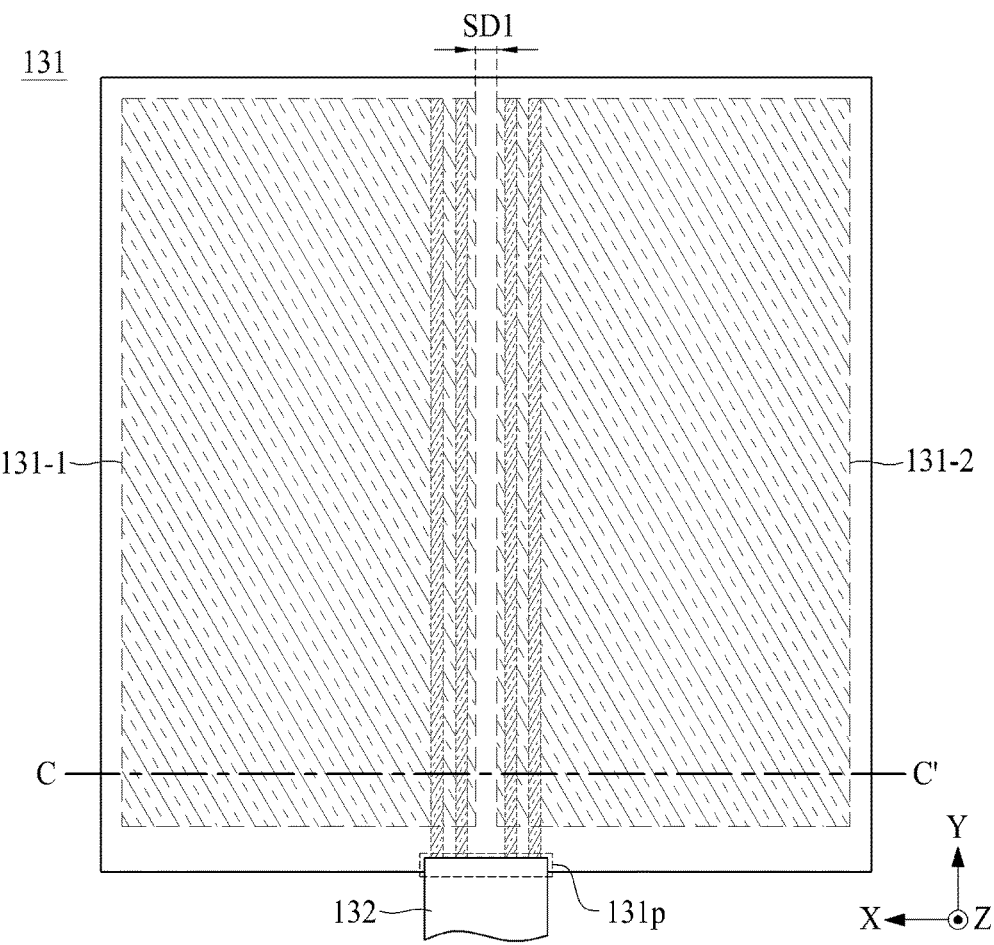
FIG. 9 illustrates a vibration device according to another embodiment of the present disclosure.
Figure 10:
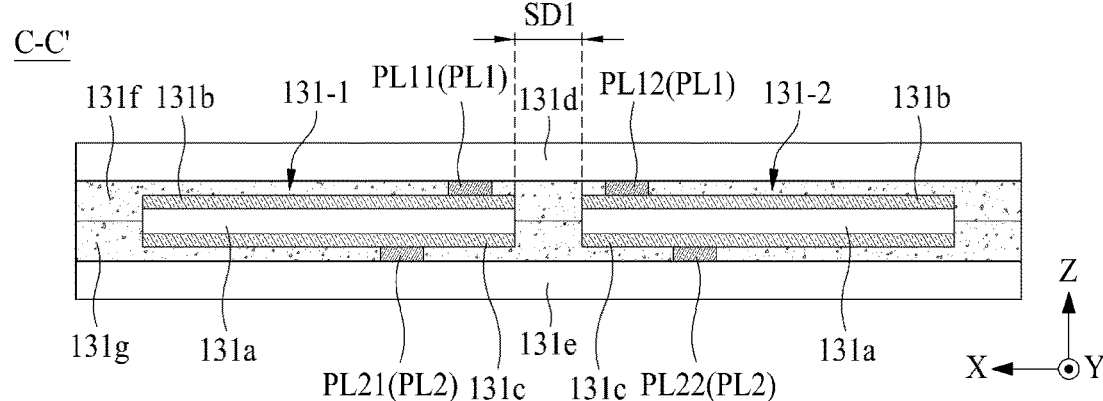
FIG. 10 is a cross-sectional view taken along line C-C' illustrated in FIG. 9, according to an embodiment of the present disclosure.

FIG. 9 illustrates a vibration device according to another embodiment of the present disclosure. FIG. 10 is a cross-sectional view taken along line C-C' illustrated in FIG. 9, according to an embodiment of the present disclosure.

Referring to FIGS. 9 and 10, the vibration device 131 according to another embodiment of the present disclosure may include first and second vibration generators 131-1 and 131-2.

The first and second vibration generators 131-1 and 131-2 may be electrically spaced apart from each other and disposed to be electrically separated from each other along the first direction X. Each of the first and second vibration generators 131-1 and 131-2 may be vibrated by alternately repeating contraction and/or expansion by a piezoelectric effect. For example, the first and second vibration generators 131-1 and 131-2 may be disposed or tiled at a predetermined distance SD1 along the first direction X. Therefore, the vibrating device 131 in which the first and second vibration generators 131-1 and 131-2 are tiled may be a vibration array, a vibration array unit, a vibration module array unit, a vibration array structure, a tiling vibration array, a tiling array module, or a tiling vibration film, and the embodiments of the present disclosure are not limited thereto.

Each of the first and second vibration generators 131-1 and 131-2 according to the embodiment of the present disclosure may have a rectangular shape. For example, each of the first and second vibration generators 131-1 and 131-2 may have a rectangular shape having a width of 5 cm or more. For example, each of the first and second vibration generators 131-1 and 131-2 may have a square shape having a size of 5 cm×5 cm or more, and the embodiments of the present disclosure are not limited thereto.

Each of the first and second vibration generators 131-1 and 131-2 may be disposed or tiled on the same plane, so that the vibration device 131 may be enlarged by tiling of the first and second vibration generators 131-1 and 131-2 having a relatively small size.

Each of the first and second vibration generators 131-1 and 131-2 may be disposed or tiled at a constant interval so that each of the vibration generators may be implemented as one vibration device (or a single vibration device) driven in the form of one complete single body without being independently driven. According to an embodiment of the present disclosure, a first spaced distance SD1 between the first and second vibration generators 131-1 and 131-2 may be 0.1 mm or more and less than 3 cm based on the first direction X, and the embodiments of the present disclosure are not limited thereto.

According to an embodiment of the present disclosure, each of the first and second vibration generators 131-1 and 131-2 may be disposed and tiled to have a first spaced distance (or interval) SD1 of 0.1 mm or more and less than 3 cm so that each of the vibration generators may be driven as one vibration device, and each of a sound reproduction band and sound pressure characteristics of sound generated in conjunction with a single body vibration of the first and second vibration generators 131-1 and 131-2 may be increased. For example, the first and second vibration generators 131-1 and 131-2 may be disposed at intervals SD1 of 0.1 mm or more and less than 5 mm in order to increase the reproduction band of sound generated in conjunction with the single body vibration of the first and second vibration generators 131-1 and 131-2 and increase sound pressure characteristics at a low-pitched range of sound, for example, 500 Hz or less.

According to an embodiment of the present disclosure, when the first and second vibration generators 131-1 and 131-2 are disposed at the distance SD1 less than 0.1 mm or without the distance SD1, reliability of the first and second vibration generators 131-1 and 131-2 or the vibration device 131 may be degraded due to occurrence breakage or cracks caused by physical contact between the first and second vibration generators 131-1 and 131-2 during vibration of each of the first and second vibration generators 131-1 and 131-2.

According to an embodiment of the present disclosure, when the first and second vibration generators 131-1 and 131-2 are disposed at the distance SD1 of 3 cm or more, the first and second vibration generators 131-1 and 131-2 may not be driven by one vibration device due to independent vibration of each of the first and second vibration generators 131-1 and 131-2. Therefore, the reproduction band of the sound generated by the vibration of the first and second vibration generators 131-1 and 131-2 and the sound pressure characteristics of the sound may be degraded. For example, when the first and second vibration generators 131-1 and 131-2 are disposed at the interval SD1 of 3 cm or more, sound characteristics and sound pressure characteristics at a low-pitched range, for example, 500 Hz or less may be degraded.

According to an embodiment of the present disclosure, when the first and second vibration generators 131-1 and 131-2 are disposed at the interval SD1 of 5 mm, each of the first and second vibration generators 131-1 and 131-2 is not driven by one vibration device, and thus sound characteristics and sound pressure characteristics may be degraded at a low-pitched range, for example, 200 Hz or less.

According to another embodiment of the present disclosure, when the first and second vibration generators 131-1 and 131-2 are disposed at the interval SD1 of 1 mm, a sound reproduction band may be increased and sound pressure characteristics at a low-pitched range, for example, 500 Hz or less may be increased as the first and second vibration generators 131-1 and 131-2 is vibrated by one vibration device. For example, when the first and second vibration generators 131-1 and 131-2 are disposed at the interval SD1 of 1 mm, the vibration device 131 may be implemented as a large-sized vibrator as the spaced distance between the first and second vibration generators 131-1 and 131-2 is optimized. Therefore, the first and second vibration generators 131-1 and 131-2 may be vibrated as a large-sized vibrator according to the single body vibration of the first and second vibration generators 131-1 and 131-2, whereby sound characteristics and/or sound pressure characteristics in a reproduction band of sound generated in conjunction with the large-sized vibration of the vibration device 131 and the low-pitched range may be increased or improved.

Accordingly, in order to implement the single body vibration (or one vibration device) of the first and second vibration generators 131-1 and 131-2, the first spaced distance SD1 between the first and second vibration generators 131-1 and 131-2 may be set to 0.1 mm or more and less than 3 cm. In addition, in order to increase sound pressure characteristics of the sound of the low-pitched range while implementing the single body vibration (or one vibration device) of the first and second vibration generators 131-1 and 131-2, the first spaced distance SD1 between the first and second vibration generators 131-1 and 131-2 may be set to 0.1 mm or more and less than 5 mm.

Each of the first and second vibration generators 131-1 and 131-2 according to an embodiment of the present disclosure may include a vibration portion 131a, a first electrode portion 131b, and a second electrode portion 131c.

The vibration portion 131a of each of the first and second vibration generators 131-1 and 131-2 may include a piezoelectric material including a piezoelectric effect or an electroactive material. For example, since the vibration portion 131a of each of the first and second vibration generators 131-1 and 131-2 is configured to be substantially the same as any one of the vibration portions 131a described with reference to FIGS. 7 and 8, the same reference numeral will be given thereto, and its redundant description will be omitted. For example, FIG. 9 illustrates the vibration portion 131a of FIG. 8, but it may be configured as the vibration portion 131a of FIG. 7.

According to an embodiment of the present disclosure, each of the first and second vibration generators 131-1 and 131-2 may include any one of the vibration portions 131a described with reference to FIGS. 7 and 8 or may include different vibration portions 131a.

The first electrode portion 131b may be disposed on the first surface of the vibration portion 131a, and may be electrically connected to the first surface of the vibration portion 131a. Since this is substantially the same as the first electrode portion 131b described with reference to FIG. 7, the same reference numeral will be given thereto, and its redundant description will be omitted.

The second electrode portion 131c may be disposed on the second surface of the vibration portion 131a, and may be electrically connected to the second surface of the vibration portion 131a. Since this is the same as the second electrode portion 131c described with reference to FIG. 7, the same reference numeral will be given thereto, and its redundant description will be omitted.

The vibration device 131 according to another embodiment of the present disclosure may further include a first cover member 131d and a second cover member 131e.

The first cover member 131d may be disposed on the first surface of the vibration device 131. For example, the first cover member 131d may cover the first electrode portion 131b disposed on the first surface of each of the first and second vibration generators 131-1 and 131-2 and thus commonly connected to the first surface of each of the first and second vibration generators 131-1 and 131-2 or commonly support the first surface of each of the first and second vibration generators 131-1 and 131-2. Therefore, the first cover member 131d may protect the first surface or the first electrode portion 131b of each of the first and second vibration generators 131-1 and 131-2.

The second cover member 131e may be disposed on the second surface of the vibration device 131. For example, the second cover member 131e may cover the second electrode portion 131c disposed on the second surface of each of the first and second vibration generators 131-1 and 131-2 and thus commonly connected to the second surface of each of the first and second vibration generators 131-1 and 131-2 or commonly support the second surface of each of the first and second vibration generators 131-1 and 131-2. Therefore, the second cover member 131e may protect the second surface or the second electrode portion 131c of each of the first and second vibration generators 131-1 and 131-2.

Each of the first cover member 131d and the second cover member 131e according to an embodiment of the present disclosure may include one or more materials of plastic, fiber, carbon, and wood, but embodiments of the present disclosure are not limited thereto. For example, the first cover member 131d and the second cover member 131e may include the same material or different materials. For example, the first cover member 131d and the second cover member 131e may be a polyimide film or a polyethylene terephthalate film, but embodiments of the present disclosure are not limited thereto.

The first cover member 131d according to an embodiment of the present disclosure may be disposed on the first surface of each of the first and second vibration generators 131-1 and 131-2 via the first adhesive layer 131f. For example, the first cover member 131d may be directly disposed on the first surface of each of the first and second vibration generators 131-1 and 131-2 by a film laminating process via the first adhesive layer 131f. Therefore, each of the first and second vibration generators 131-1 and 131-2 may be integrated (or disposed) or tiled to the first cover member 131d so as to have the constant interval SD1.

The second cover member 131e according to an embodiment of the present disclosure may be disposed on the second surface of each of the first and second vibration generators 131-1 and 131-2 via the second adhesive layer 131g. For example, the second cover member 131e may be directly disposed on the second surface of each of the first and second vibration generators 131-1 and 131-2 by a film laminating process via the second adhesive layer 131g. Therefore, each of the first and second vibration generators 131-1 and 131-2 may be integrated (or disposed) or tiled to the second cover member 131e so as to have the constant interval SD1.

The first adhesive layer 131f may be disposed between the first and second vibration generators 131-1 and 131-2 and on the first surface of each of the first and second vibration generators 131-1 and 131-2. For example, the first adhesive layer 131f may be formed on the rear surface (or inner surface) of the first cover member 131d, which faces the first surface of each of the first and second vibration generators 131-1 and 131-2, may be filled between the first and second vibration generators 131-1 and 131-2, and may be disposed between the first surface of each of the first and second vibration generators 131-1 and 131-2 and the first cover member 131d.

The second adhesive layer 131g may be disposed between the first and second vibration generators 131-1 and 131-2 and on the second surface of each of the first and second vibration generators 131-1 and 131-2. For example, the second adhesive layer 131g may be formed on the front surface (or inner surface) of the second cover member 131e, which faces the second surface of each of the first and second vibration generators 131-1 and 131-2, may be filled between the first and second vibration generators 131-1 and 131-2, and may be disposed between the second surface of each of the first and second vibration generators 131-1 and 131-2 and the second cover member 131e.

The first and second adhesive layers 131f and 131g may be connected or coupled to each other between the first and second vibration generators 131-1 and 131-2. Therefore, each of the first and second vibration generators 131-1 and 131-2 may be surrounded by the first and second adhesive layers 131f and 131g. For example, the first and second adhesive layers 131f and 131g may be configured between the first cover member 131d and the second cover member 131e to completely surround each of the first and second vibration generators 131-1 and 131-2. For example, each of the first and second vibration generators 131-1 and 131-2 may be buried or embedded between the first adhesive layer 131f and the second adhesive layer 131g.

Each of the first and second adhesive layers 131f and 131g according to an embodiment of the present disclosure may include an electric insulating material capable of being compressed and restored while having an adhesive property. For example, each of the first and second adhesive layers 131f and 131g may include an epoxy resin, an acrylic resin, a silicone resin, or a urethane resin, and the embodiments of the present disclosure are not limited thereto. For example, each of the first and second adhesive layers 131f and 131g may be configured to be transparent, translucent or opaque.

The vibration device 131 according to another embodiment of the present disclosure may further include a first power supply line PL1, a second power supply line PL2, and a pad portion 131p.

The first power supply line PL1 may be disposed in the first cover member 131d. For example, the first power supply line PL1 may be disposed on the rear surface of the first cover member 131d, which faces the first surface of each of the first and second vibration generators 131-1 and 131-2. The first power supply line PL1 may be electrically connected to the first electrode portion 131b of each of the first and second vibration generators 131-1 and 131-2. For example, the first power supply line PL1 may be directly and electrically connected to the first electrode portion 131b of each of the first and second vibration generators 131-1 and 131-2. For example, the first power supply line PL1 may be electrically connected to the first electrode portion 131b of each of the first and second vibration generators 131-1 and 131-2 via an anisotropic conductive film. As another example, the first power supply line PL1 may be electrically connected to the first electrode portion 131b of each of the first and second vibration generators 131-1 and 131-2 through a conductive material (or particles) contained in the first adhesive layer 131f.

The first power supply line PL1 according to an embodiment of the present disclosure may include first and second upper power lines PL11 and PL12 disposed along the second direction Y. For example, the first upper power line PL11 may be electrically connected to the first electrode portion 131b of the first vibration generator 131-1. The second upper power line PL12 may be electrically connected to the first electrode portion 131b of the second vibration generator 131-2.

The second power supply line PL2 may be disposed in the second cover member 131e. For example, the second power supply line PL2 may be disposed on the front surface of the second cover member 131e, which faces the second surface of each of the first and second vibration generators 131-1 and 131-2. The second power supply line PL2 may be electrically connected to the second electrode portion 131c of each of the first and second vibration generators 131-1 and 131-2. For example, the second power supply line PL2 may be directly and electrically connected to the second electrode portion 131c of each of the first and second vibration generators 131-1 and 131-2. For example, the second power supply line PL2 may be electrically connected to the second electrode portion 131c of each of the first and second vibration generators 131-1 and 131-2 via an anisotropic conductive film. As another example, the second power supply line PL2 may be electrically connected to the second electrode portion 131c of each of the first and second vibration generators 131-1 and 131-2 through a conductive material (or particles) contained in the second adhesive layer 131g.

The second power supply line PL2 according to an embodiment of the present disclosure may include first and second lower power lines PL21 and PL22 disposed along the second direction Y. The first lower power line PL21 may be electrically connected to the second electrode portion 131c of the first vibration generator 131-1. According to the embodiment of the present disclosure, the first upper power line PL11 may be disposed so as not to overlap the first lower power line PL21. When the first upper power line PL11 is disposed so as not to overlap the first lower power line PL21, a problem of a short circuit failure between the first upper power line PL11 and the first lower power line PL21 may be improved. According to the embodiment of the present disclosure, the second upper power line PL12 may be disposed so as not to overlap the second lower power line PL22. When the second upper power line PL12 is disposed so as not to overlap the second lower power line PL22, a problem of a short circuit failure between the second upper power line PL12 and the second lower power line PL22 may be reduced.

The pad portion 131p may be electrically connected to the first power supply line PL1 and the second power supply line PL2. For example, the pad portion 131p may be formed at one edge portion of one of the first cover member 131d and the second cover member 131e so that the pad portion 131p may be electrically connected to one side (or one end) of each of the first power supply line PL1 and the second power supply line PL2.

The pad portion 131p according to an embodiment of the present disclosure may include a first pad electrode electrically connected to one end (or one side) of the first power supply line PL1 and a second pad electrode electrically connected to one end (or one side) of the second power supply line PL2.

The first pad electrode may be commonly connected to one end (or one side) of each of the first and second upper power lines PL11 and PL12 of the first power supply line PL1. For example, one end of each of the first and second upper power lines PL11 and PL12 may be branched from the first pad electrode. The second pad electrode may be commonly connected to one end of each of the first and second lower power lines PL21 and PL22 of the second power supply line PL2. For example, one end (or one side) of each of the first and second lower power lines PL21 and PL22 may be branched from the second pad electrode.

The vibration device 131 according to another embodiment of the present disclosure may further include a signal cable 132.

The signal cable 132 may be electrically connected with the pad portion 131p disposed in the vibration device 131 and may supply the vibration device 131 with a vibration driving signal (or a sound signal or a voice signal) provided from a sound processing circuit. The signal cable 132 according to an embodiment of the present disclosure may include a first terminal electrically connected with a first pad electrode of the pad portion 131p and a second terminal electrically connected with a second pad electrode of the pad portion 131p. For example, the signal cable 132 may be configured as a flexible printed circuit cable, a flexible flat cable, a single-sided flexible printed circuit, a single-sided flexible printed circuit board (PCB), a flexible multi-layer printed circuit, or a flexible multi-layer PCB, but embodiments of the present disclosure are not limited thereto.

The sound processing circuit may generate an AC type vibration driving signal, which includes a first vibration driving signal and a second vibration driving signal, based on sound data. The first vibration driving signal may be any one of a positive (+) vibration driving signal and a negative (−) vibration driving signal, and the second vibration driving signal may be any one of a positive (+) vibration driving signal and a negative (−) vibration driving signal. For example, the first vibration driving signal may be supplied to the first electrode portion 131b of each of the first and second vibration generators 131-1 and 131-2 through a first terminal of the signal cable 132, the first pad electrode of the pad portion 131p and the first power supply line PL1. The second vibration driving signal may be supplied to the second electrode portion 131c of each of the first and second vibration generators 131-1 and 131-2 through a second terminal of the signal cable 132, the second pad electrode of the pad portion 131p and the second power supply line PL2.

Figure 11:
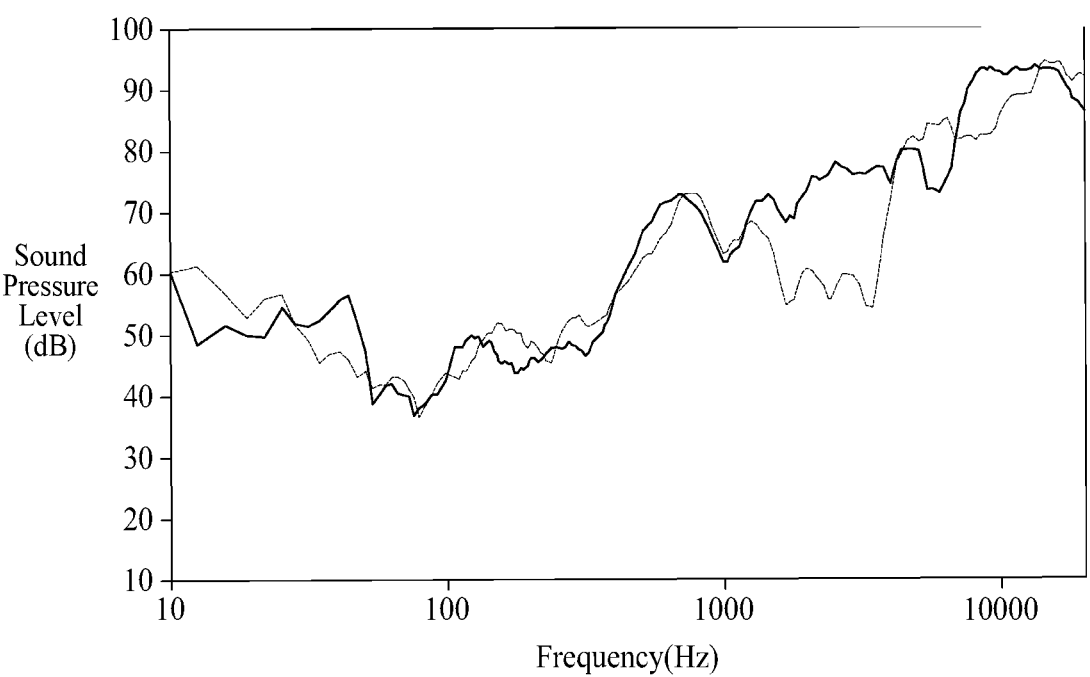
FIG. 11 illustrates sound output characteristics of a sound apparatus according to an experimental example and the embodiment of the present disclosure.

FIG. 11 illustrates sound output characteristics of a sound apparatus according to the embodiment of the present disclosure.

The sound output characteristics may be measured by sound analysis equipment. The sound analysis equipment may include a sound card for transmitting and receiving sound to and from a control PC, an amplifier for amplifying and transmitting the sound generated from the sound card to the sound apparatus, and a microphone for collecting the sound generated through the sound apparatus in the vibration member. For example, the microphone may be disposed at the center of the sound apparatus, and a distance between the vibration member and the microphone may be 50 cm. The sound may be measured by making the microphone perpendicular to the sound apparatus. The sound collected by the microphone is input to the control PC through the sound card, and the sound is checked in a control program to analyze the sound of the sound apparatus. For example, a frequency response property in a frequency range of 100 Hz to 20 kHz may be measured using a pulse program.

In FIG. 11, a horizontal axis represents frequency (Hz), and a vertical axis represents a sound pressure level (SPL, dB). A solid line of FIG. 11 represents sound output characteristics of the sound apparatus of FIGS. 3 to 5. In the sound apparatus of FIGS. 3 to 5, the connection member is made of a silicon material. A dotted line in FIG. 11 represents the sound output characteristics of the sound apparatus comprising a connection member between the vibration member and the enclosure.

Referring to FIG. 11, it is noted that the solid line represents improved sound output characteristics in a frequency range of 2 kHz to 4 kHz and 2 kHz to 10 kHz as compared with the dotted line. For example, the solid line represents the improved peak and/or dip phenomena in a middle-pitched range and/or high-pitched range as compared with the dotted line. Therefore, the solid line presents that the sound pressure in the middle-pitched range and/or the high-pitched range may be improved as compared with the dotted line. For example, it is noted that the solid line represents that the sound pressure is improved by about 20 dB or more on average at 2 kHz to 4 kHz as compared with the dotted line, and is improved by about 5 dB or more in a frequency range of 6 kHz to 10 kHz.

When the sound apparatus 100 is applied to the flexible device, a problem occurs in that a crack or breakage is generated due to the brittleness characteristics of the vibration apparatus 130 that is a piezoelectric element. For example, when a crack is generated by external impact, an electrical short occurs in the first electrode portion 131b and the second electrode portion 131c of the vibration apparatus 130. In addition, a problem occurs in that the vibration apparatus 130 is damaged in a transportation process before the vibration apparatus 130 is attached to the vibration member 110 or a process of attaching the vibration apparatus 130 to the vibration member 110. Therefore, the inventors of the present disclosure have performed various studies and experiments for enhancing rigidity of the vibration apparatus 130 and implementing a vibration device resistant to impact. The inventors of the present disclosure have invented a new vibration device which may have rigidity and impact resistance through various studies and experiments. This will be described below.

Figure 12:
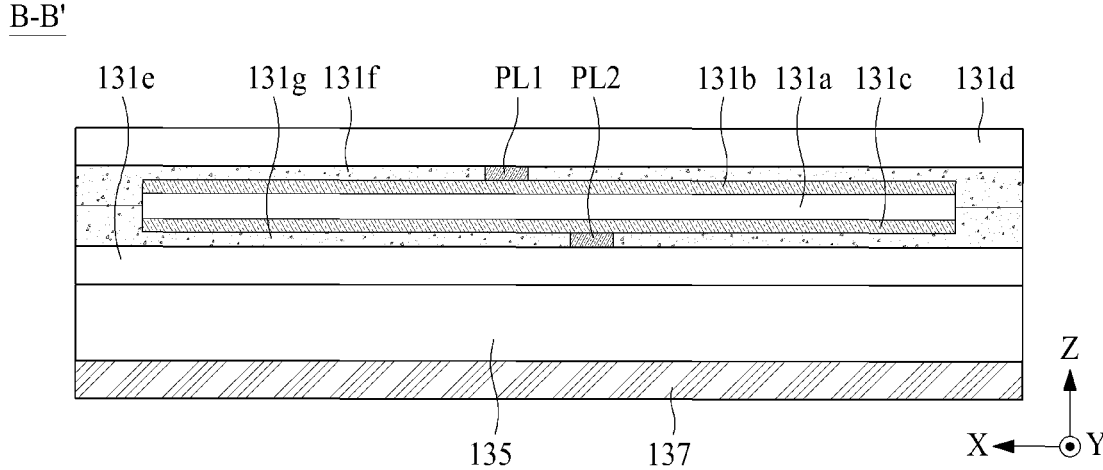
FIG. 12 is another cross-sectional view taken along line B-B' illustrated in FIG. 6 according to another embodiment of the present disclosure.

FIG. 12 is another cross-sectional view taken along line B-B' illustrated in FIG. 6 according to one embodiment.

Referring to FIG. 12, the sound apparatus 100 according to another embodiment of the present disclosure may further include one or more buffer members. The one or more buffer members may protect the vibration apparatus 130 from external impact. The vibration portion 131a of FIG. 12 may be configured as the vibration portion of FIG. 8.

The one or more buffer members according to the embodiment of the present disclosure may be below the vibration apparatus 130. The one or more buffer members may include a first buffer member 135 and a second buffer member 137. In FIG. 12, the first cover member 131d may be connected or coupled to the vibration member 110. For example, the vibration apparatus 130 including the first cover member 131d may be connected to or coupled to the vibration member 110 via the adhesive member 120. According to another embodiment of the present disclosure, the vibration apparatus 130 including the second cover member 131e may be connected to or coupled to the vibration member 110 via the adhesive member 120.

The first buffer member 135 according to the embodiment of the present disclosure may be disposed on the second cover member 131e or below the second cover member 131e. The first buffer member 135 according to another embodiment of the present disclosure may be disposed on the first cover member 131d or over the first cover member 131d. The second buffer member 137 may be disposed on the first buffer member 135. The first buffer member 135 may be disposed to be more adjacent to the vibration apparatus 130 than the second buffer member 137. The first buffer member 135 may be made of a material having an elastic modulus different from that of the second buffer member 137. For example, the elastic modulus (or Young's modulus) of the first buffer member 135 may be different from the elastic modulus (or Young's modulus) of the second buffer member 137. For example, the first buffer member 135 may be made of a material having an elastic modulus lower than that of the second buffer member 137.

The second buffer member 137 according to the embodiment of the present disclosure may be made of a material having an elastic modulus capable of dispersing external impact. For example, the second buffer member 137 may be made of a material having an elastic modulus capable of dispersing external impact in the horizontal direction of the vibration apparatus 130. For example, the second buffer member 137 may be made of a material having a high elastic modulus. Therefore, impact energy locally generated by external impact may be widely dispersed. Since the vibration apparatus 130 according to the embodiment of the present disclosure may reinforce rigidity by the second buffer member 137, a problem such as a crack occurring in a transportation process or an attachment process of the vibration apparatus 130 may be solved. For example, the second buffer member 137 may be made of polyethylene terephthalate and the like, and the embodiments of the present disclosure are not limited thereto. For example, the second buffer member 137 may be an impact dispersion member or an impact dispersion layer, and the embodiments of the present disclosure are not limited thereto.

The first buffer member 135 according to the embodiment of the present disclosure may be made of a material capable of absorbing external impact. For example, since the first buffer member 135 is configured to be more adjacent to the vibration apparatus 130 than the second buffer member 137, the first buffer member 135 may be made of a material capable of absorbing external impact. For example, the first buffer member 135 may be made of a material having an elastic modulus capable of absorbing external impact. For example, the first buffer member 135 may be made of a material having an elastic modulus lower than that of the second buffer member 137. For example, the first buffer member 135 may be made of polyurethane, polyurethane foam, or the like, and the embodiments of the present disclosure are not limited thereto. For example, the first buffer member 135 may be a shock absorbing member or a shock absorbing layer, and the embodiments of the present disclosure are not limited thereto.

According to the embodiment of the present disclosure, since the first buffer member 135 and the second buffer member 137 are configured, the vibration apparatus 130 may be protected from external impact, and cracks that may occur during a transportation process or an attachment process of the vibration apparatus 130 may be reduced.

Figure 13A:
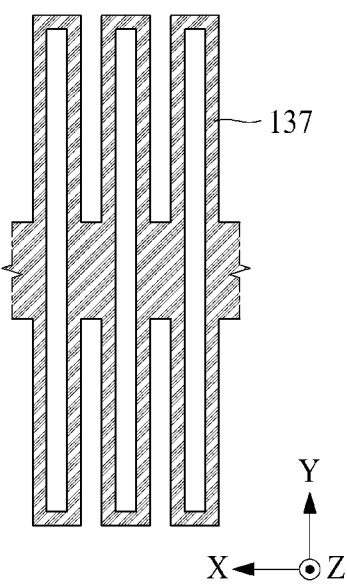
FIGS. 13A and 13B illustrate a buffer member according to another embodiment of the present disclosure.
Figure 13B:
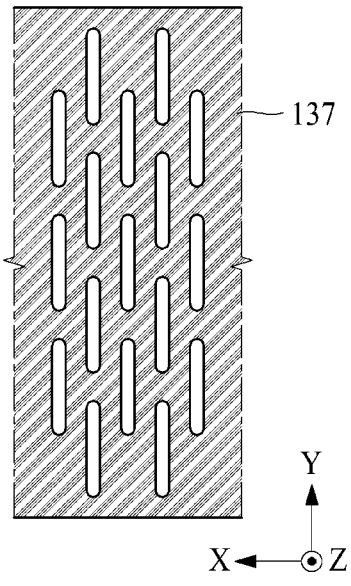

FIGS. 13A and 13B illustrate a buffer member according to another embodiment of the present disclosure.

Referring to FIGS. 13A and 13B, the second buffer member 137 may further include a pattern. For example, the pattern may be attached to the vibration member 110 having a curved surface or may be configured to make sure of flexibility in consideration of a lamination process. The pattern may be configured in a direction perpendicular to a bending direction of the vibration member 110. The pattern may be a slit or a groove, and the embodiments of the present disclosure are not limited thereto.

Referring to FIG. 13A, the pattern may be uniformly configured. Referring to FIG. 13B, the pattern may be configured to be non-uniform. The pattern may be configured to have various shapes, and the embodiments of the present disclosure are not limited thereto.

Table 1 is a result of a ball-drop test according to an experimental example and the embodiment of the present disclosure.

TABLE 1

| | Experimental example | Embodiment 1 | Embodiment 2 |
|---|---|---|---|
| Result | 4 cm | 23 cm | 50 cm or more |

The experimental example in Table 1 is a sound apparatus that does not constitute the first buffer member and the second buffer member according to the embodiment of the present disclosure. As described with reference to FIG. 12, Embodiments 1 and 2 are sound apparatuses that constitute the first buffer member and the second buffer member according to the embodiment of the present disclosure. The first buffer member of the Embodiments 1 and 2 is made of polyurethane foam. The first buffer member of the Embodiments 1 and 2 is made of polyethylene terephthalate. In the Embodiment 1, a thickness of the first buffer member is 1 mm, and a thickness of the second buffer member is 0.1 mm. In the Embodiment 2, a thickness of the first buffer member is 3 mm, and a thickness of the second buffer member is 0.1 mm. The materials of the first buffer member and the second buffer member do not limit the present disclosure. The thicknesses of the first buffer member and the second buffer member do not limit the present disclosure.

In the ball-drop test, a diameter of a ball is 18 mm, and a weight of the ball is 21.68 g. A distance between a ball drop cylinder device guiding falling of the ball and the sound apparatus is 5 cm. The ball-drop test may be a test for checking whether the sound apparatus is damaged by dropping the ball through the ball drop cylinder while changing a height of the ball drop in the cylinder of the ball drop cylinder device on an upper portion of the sound apparatus. For example, the higher the height of the ball drop where damage to the sound apparatus begins to occur, the better the sound apparatus will withstand external impact. For example, in the apparatus of FIG. 12, the ball drop height is changed from the upper portion of the second buffer member 137 and the ball drops to determine whether the sound apparatus is damaged. For example, in the ball-drop test, the sound apparatus of FIG. 12 includes the vibration member 110, the adhesive member 120, and the vibration apparatus 130 of FIG. 2 except for the connection member 140 and the enclosure 150. The vibration apparatus 130 is configured as the device of FIG. 12, and the sound apparatus of FIG. 12 is inverted up and down, and then the ball drops while the height of the ball drop at the upper portion of the second buffer member 137 is changed to check whether the sound apparatus is damaged.

Table 1 shows the height of the ball drop in which damage to the sound apparatus, for example a crack, begins to occur in the ball-drop test. In the experimental example, cracks occurred in the sound apparatus at a height of 4 cm. In the Embodiment 1, cracks occurred in the sound apparatus at a height of 23 cm. In the Embodiment 2, cracks occurred in the sound apparatus at a height of 50 cm or more. Therefore, it is noted that the sound apparatus to which the buffer member is applied has improved rigidity and/or impact resistance as compared with the experimental example to which the buffer member is not applied. Since the Embodiment 2 is configured that the first buffer member is thicker than that of the Embodiment 1, it is noted that rigidity and/or impact resistance of the Embodiment 2 was improved as compared with the Embodiment 1. For example, it is noted from the Embodiments 1 and 2 that since the height at which damage occurs in the sound apparatus is higher as compared with the experimental example, the sound apparatuses of the Embodiments 1 and 2 may better withstand external impact, and rigidity and/or impact resistance was improved.

Figure 14:
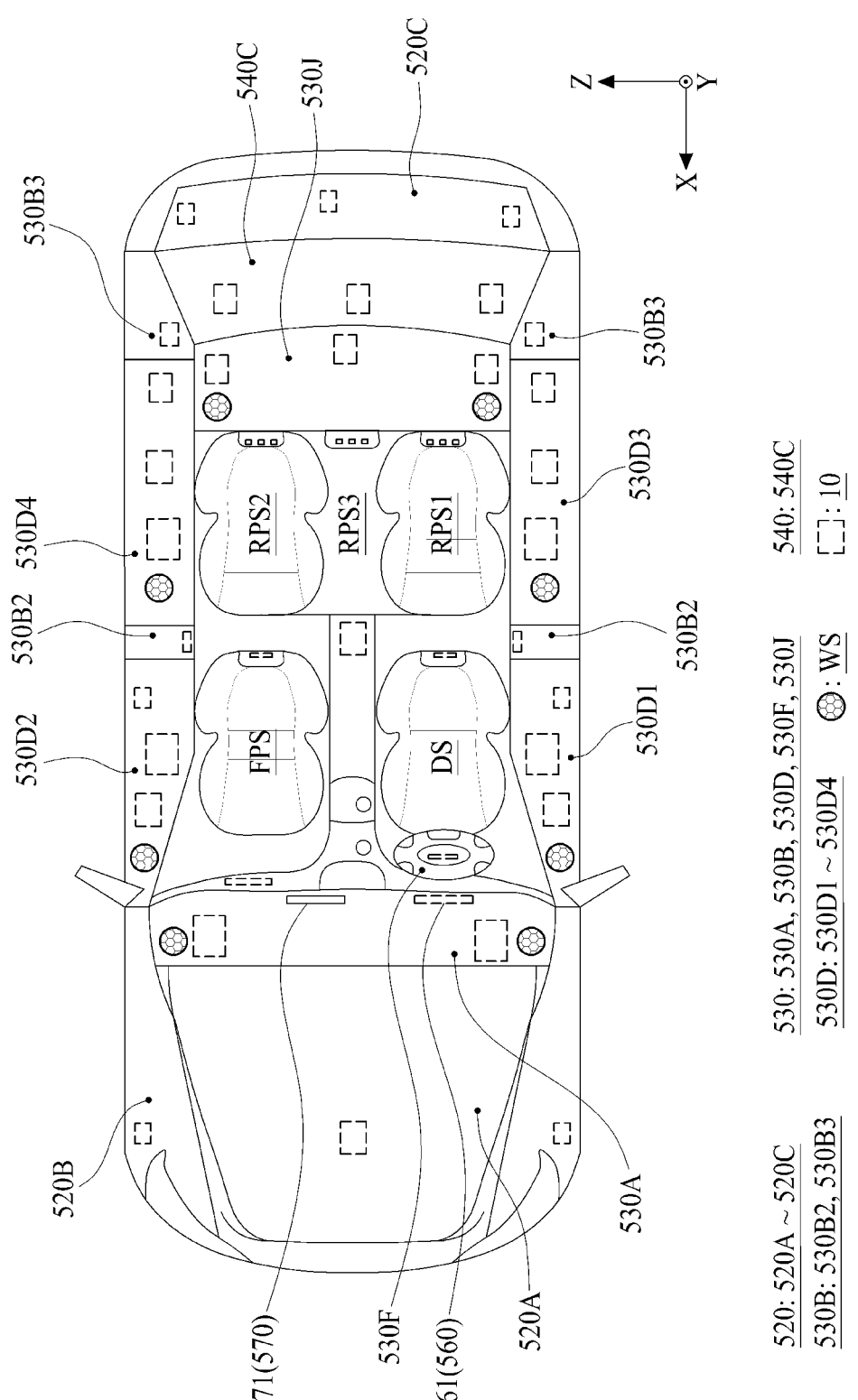
FIG. 14 illustrates a vehicular apparatus according to an embodiment of the present disclosure.
Figure 15:
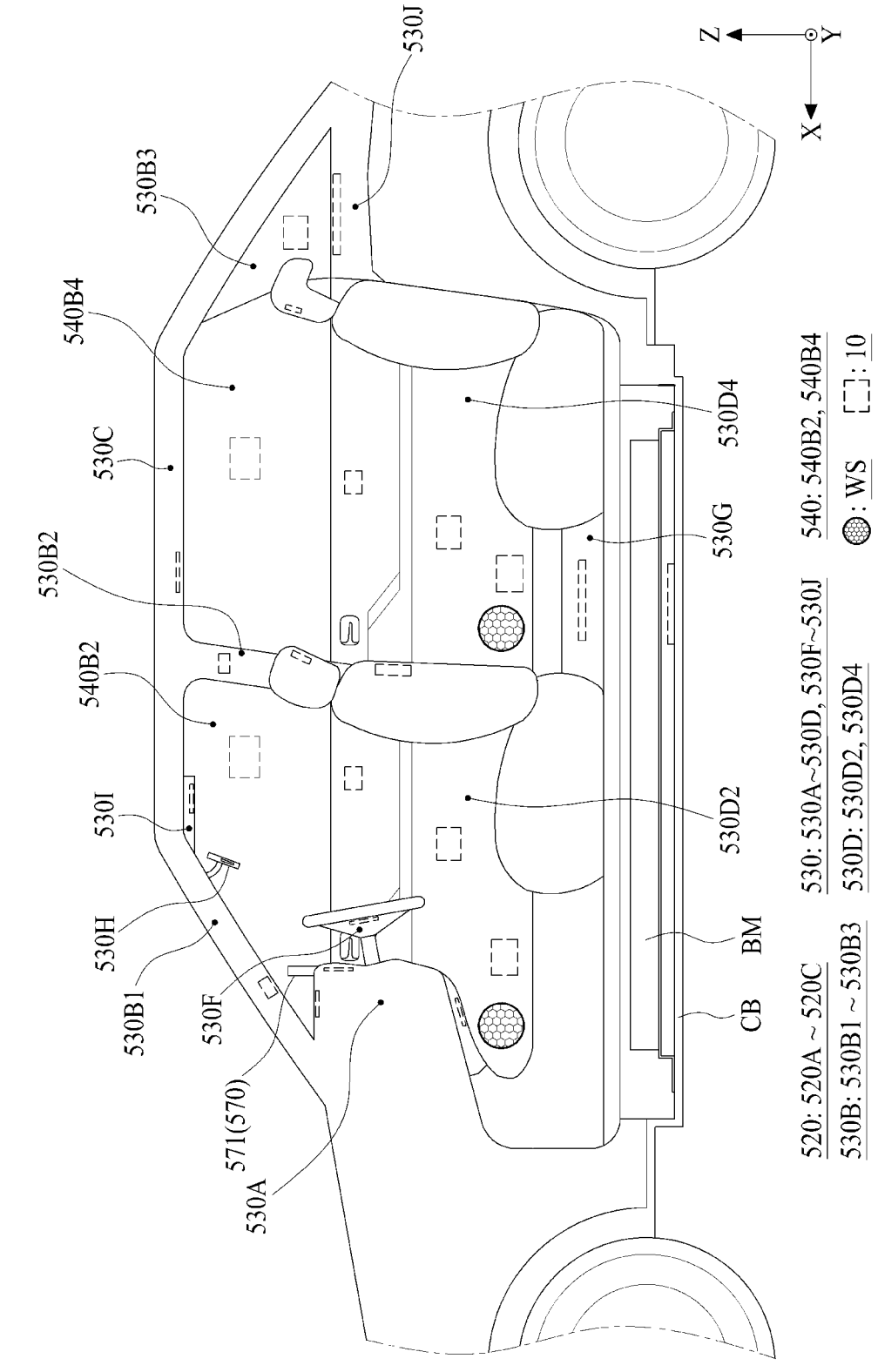
FIG. 15 is a cross-sectional view illustrating a vehicular apparatus according to an embodiment of the present disclosure.

FIG. 14 illustrates a vehicular apparatus according to an embodiment of the present disclosure. FIG. 15 is a cross-sectional view illustrating a vehicular apparatus according to an embodiment of the present disclosure.

Referring to FIGS. 14 and 15, the vehicular apparatus according to the embodiment of the present disclosure may include one or more sound generating apparatuses 10 configured to output sound from one or more of an exterior material 520 and an interior material 530. For example, one or more of the exterior material 520 and the interior material 530 may output sound in accordance with vibration of the one or more sound generating apparatuses 10. In FIGS. 14 and 15, a portion indicated by a dotted line indicates a portion where one or more sound generating apparatuses 10 may be disposed.

The one or more sound generating apparatuses 10 are disposed in the exterior material 520 or the interior material 530 or between the exterior material 520 and the interior material 530 to output sound. For example, the one or more sound generating apparatuses 10 may be disposed in the exterior material 520, in the interior material 530, and/or between the exterior material 520 and the interior material 530 to output sound.

The interior material according to the embodiment of the present disclosure may include at least one of a dashboard 530A, a pillar interior material 530B, a roof interior material 530C, a door interior material 530D, a seat interior material, a handle interior material 530F, a floor interior material 530G or a rear package interior material 530J. The one or more sound generating apparatuses 10 may vibrate at least one of the dashboard 530A, the pillar interior material 530B, the roof interior material 530C, the door interior material 530D, the seat interior material, the handle interior material 530F, the floor interior material 530G or the rear package interior material 530J. The one or more sound generating apparatuses 10 may be disposed between the exterior material 520 and at least one of the dashboard 530A, the pillar interior material 530B, the roof interior material 530C, the door interior material 530D, the seat interior material, the handle interior material 530F or the floor interior material 530G. Therefore, sound of one or more channels may be output.

For example, at least one of the one or more sound generating apparatuses 10 may be configured to be transparent or translucent. For example, when a window is entirely transparent, at least one of the one or more sound generating apparatuses 10 may be configured to be transparent, and may be disposed in an intermediate area or a peripheral area of the window. When a glass window includes a translucent portion or an opaque portion, at least one of the one or more sound generating apparatuses 10 may be configured to be translucent or opaque, and may be disposed in a translucent portion or an opaque portion of the glass window. For example, at least one of the one or more sound generating apparatuses 10 may be a transparent vibration generator, a transparent vibration generating device or a transparent sound generating device, and the embodiments of the present disclosure are not limited thereto.

Referring to FIGS. 14 and 15, the one or more sound generating apparatuses 10 according to the embodiment of the present disclosure may be disposed between a dash panel and the dashboard 530A, and may be configured to output sound by indirectly or directly vibrating the dashboard 530A. For example, since the one or more sound generating apparatuses 10 include the sound apparatus 100 described with reference to FIGS. 1 to 13B, redundant description thereof will be omitted. For example, the one or more sound generating apparatuses 10 may be a dashboard speaker or a first speaker, and the embodiments of the present disclosure are not limited thereto.

According to an embodiment of the present disclosure, one or more of the dash panel and the dashboard 530A may include a first region corresponding to a driver seat DS, a second region corresponding to a front passenger seat FPS, and a third region (or a middle region) between the first region and the second region. One or more of the dash panel and the dashboard 530A may include a fourth region which is inclined to face the front passenger seat FPS. According to an embodiment of the present disclosure, the one or more sound generating apparatuses 10 may be disposed to vibrate one or more of the first to fourth regions of the dashboard 530A. For example, the one or more sound generating apparatuses 10 may be disposed in each of the first and second regions of the dashboard 530A, or may be disposed in each of the first to fourth regions. For example, the one or more sound generating apparatuses 10 may be disposed in one or more of the first and second regions of the dashboard 530A, or may be disposed in one or more of the first to fourth regions. For example, the one or more sound generating apparatuses 10 may be configured to output a sound of 150 Hz to 20 kHz. For example, the one or more sound generating apparatuses 10 configured to vibrate one or more of the first to fourth regions of the dashboard 530A may have the same sound output characteristic or different sound output characteristics. For example, the one or more sound generating apparatuses 10 configured to vibrate each of the first to fourth regions of the dashboard 530A may have the same sound output characteristic or different sound output characteristics.

The one or more sound generating apparatuses 10 according to an embodiment of the present disclosure may be disposed between a pillar panel and the pillar interior material 530B and may be configured to indirectly or directly vibrate the pillar interior material 530B to output a sound. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be referred to as a pillar speaker, a tweeter speaker, or a second speaker, but embodiments of the present disclosure are not limited thereto.

According to an embodiment of the present disclosure, the pillar panel may include a first pillar (or an A pillar) which is disposed at both sides of a front window, a second pillar (or a B pillar) which is disposed at both sides of a center of a vehicle body, and a third pillar (or a C pillar) which is disposed at both sides of a rear portion of the vehicle body. The pillar interior material 530B may include a first pillar interior material 530B1 which covers the first pillar, a second pillar interior material 530B2 which covers the second pillar, and a third pillar interior material 530B3 which covers the third pillar. According to an embodiment of the present disclosure, the one or more sound generating apparatuses 10 may be disposed in one or more of a region between the first pillar and the first pillar interior material 530B1, a region between the second pillar and the second pillar interior material 530B2, and a region between the third pillar and the third pillar interior material 530B3, and thus, may vibrate one or more of the first to third pillar interior materials 530B1 to 530B3. For example, the one or more sound generating apparatuses 10 may be configured to output a sound of 2 kHz to 20 kHz, but embodiments of the present disclosure are not limited thereto. For example, the one or more sound generating apparatuses 10 may be configured to output a sound of 150 Hz to 20 kHz. For example, the one or more sound generating apparatuses 10 configured to vibrate one or more of the first to third pillar interior materials 530B1 to 530B3 may have the same sound output characteristic or different sound output characteristics.

The one or more sound generating apparatuses 10 according to an embodiment of the present disclosure may be disposed between a roof panel and the roof interior material 530C and may be configured to indirectly or directly vibrate the roof interior material 530C to output a sound. For example, at least one of the one or more sound generating apparatuses 10 may be configured to be transparent or translucent. For example, since the one or more sound generating apparatuses 10 include the sound apparatus 100 described with reference to FIGS. 1 to 13B, redundant description thereof will be omitted. For example, the one or more sound generating apparatuses 10 may be a roof speaker or a third speaker, and the embodiments of the present disclosure are not limited thereto.

According to an embodiment of the present disclosure, one or more of the roof panel and the roof interior material 530C covering the roof panel may include a first region corresponding to the driver seat DS, a second region corresponding to the front passenger seat FPS, a third region corresponding to a region between the driver seat DS and the front passenger seat FPS, a fourth region corresponding to a first rear passenger seat RPS1 behind the driver seat DS, a fifth region corresponding to a second rear passenger seat RPS2 behind the front passenger seat FPS, a sixth region corresponding to a third rear passenger set RPS3 between the first rear passenger seat RPS1 and the second rear passenger seat RPS2, and a seventh region between the third region and the sixth region. For example, the one or more sound generating apparatuses 10 may be configured to vibrate one or more of the first to seventh regions of the roof interior material 530C. For example, the one or more sound generating apparatuses 10 may be configured to output a sound of 150 Hz to 20 kHz. For example, the one or more sound generating apparatuses 10 configured to vibrate one or more of the first to seventh regions of the roof interior material 530C may have the same sound output characteristic or different sound output characteristics. For example, the one or more sound generating apparatuses 10 configured to vibrate each of the first to seventh regions of the roof interior material 530C may have the same sound output characteristic or different sound output characteristics. For example, one or more of the one or more sound generating apparatuses 10 configured to vibrate one or more of the first to seventh regions of the roof interior material 530C may be configured to output a sound of 2 kHz to 20 kHz, and the other may be configured to output a sound of 150 Hz to 20 kHz. For example, one or more of one or more sound generating apparatuses 10 configured to vibrate each of the first to seventh regions of the roof interior material 530C may be configured to output a sound of 2 kHz to 20 kHz, and the other may be configured to output a sound of 150 Hz to 20 KHz.

According to an embodiment of the present disclosure, the one or more sound generating apparatuses 10 may be disposed between a door frame and the door interior material 530D and may be configured to indirectly or directly vibrate the door interior material 530D to output a sound. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be referred to as a door speaker or a fourth speaker, but embodiments of the present disclosure are not limited thereto.

According to an embodiment of the present disclosure, with respect to a height direction Z, one or more of the door frame and the door interior material 530D may include an upper region, a middle region, and a lower region. For example, the one or more sound generating apparatuses 10 may be disposed in one or more of an upper region, a middle region, and a lower region between the door frame and the door interior material 530D, and thus, may vibrate one or more of the upper region, the middle region, and the lower region of the door interior material 530D.

According to the embodiment of the present disclosure, an upper area of the door interior material 530D may include a curved portion having a relatively small radius of curvature. The one or more sound generating apparatuses 10 for vibrating the upper area of the door interior material 530D may be bent into a shape that follows a shape (or surface topology) of the curved portion of the upper area of the door interior material 530D due to the second portion 131*a*2 having flexibility of the vibration device 131 shown in one or more of the sound apparatuses of FIGS. 6 to 10.

According to an embodiment of the present disclosure, the door frame may include a first door frame (or a left front door frame), a second door frame (or a right front door frame), a third door frame (or a left rear door frame), and a fourth door frame (or a right rear door frame). According to an embodiment of the present disclosure, the door interior material 530D may include a first door interior material (or a left front door interior material) 530D1 covering the first door frame, a second door interior material (or a right front door interior material) 530D2 covering the second door frame, a third door interior material (or a left rear door interior material) 530D3 covering the third door frame, and a fourth door interior material (or a right rear door interior material) 530D4 covering the fourth door frame. For example, the one or more sound generating apparatuses 10 may be disposed in one or more of an upper region, a middle region, and a lower region between each of the first to fourth door frames and the first to fourth door interior materials 530D1 to 530D4, and thus, may vibrate one or more of the upper region, the middle region, and the lower region of each of the first to fourth door interior materials 530D1 to 530D4.

According to an embodiment of the present disclosure, the one or more sound generating apparatuses 10 configured to vibrate the upper region of each of the first to fourth door interior materials 530D1 to 530D4 may be configured to output a sound of 2 kHz to 20 kHz, or may be configured to output a sound of 150 Hz to 20 kHz. For example, the one or more sound generating apparatuses 10 configured to vibrate the upper region of one or more of the first to fourth door interior materials 530D1 to 530D4 may be configured to output a sound of 2 kHz to 20 kHz, or may be configured to output a sound of 150 Hz to 20 kHz.

According to an embodiment of the present disclosure, the one or more sound generating apparatuses 10 configured to vibrate the middle region or/and the lower region of one or more of the first to fourth door interior materials 530D1 to 530D4 may be configured to output a sound of 150 Hz to 20 kHz. The one or more sound generating apparatuses 10 configured to vibrate the middle region or/and the lower region of each of the first to fourth door interior materials 530D1 to 530D4 may be configured to output a sound of 150 Hz to 20 kHz. For example, the one or more sound generating apparatuses 10 configured to vibrate the middle region or/and the lower region of one or more of the first to fourth door interior materials 530D1 to 530D4 may be one or more of a woofer, a mid-woofer, and a sub-woofer. For example, the one or more sound generating apparatuses 10 configured to vibrate the middle region or/and the lower region of each of the first to fourth door interior materials 530D1 to 530D4 may be one or more of a woofer, a mid-woofer, and a sub-woofer.

Sounds output from each of the one or more sound generating apparatuses 10 disposed in the first door interior material 530D1 and the one or more sound generating apparatuses 10 disposed in the second door interior material 530D2 may be combined and output. For example, sounds output from one or more of one or more sound generating apparatuses 10 disposed in the first door interior material 530D1 and the one or more sound generating apparatuses 10 disposed in the second door interior material 530D2 may be combined and output. Also, sounds output from the one or more sound generating apparatuses 10 disposed in the third door interior material 530D3 and sounds output from the one or more sound generating apparatuses 10 disposed in the fourth door interior material 530D4 may be combined and output.

According to an embodiment of the present disclosure, the upper region of each of the first to fourth door interior materials 530D1 to 530D4 may include a first upper region adjacent to the dashboard 530A, a second upper region adjacent to rear passenger seats RPS1 to RPS3, and a third upper region between the first upper region and the second upper region. For example, the one or more sound generating apparatuses 10 may be disposed in one or more of the first to third upper regions of each of the first to fourth door interior materials 530D1 to 530D4. For example, the one or more sound generating apparatuses 10 may be disposed in the first upper region of each of the first and second door interior materials 530D1 and 530D2, and the one or more sound generating apparatuses 10 may be disposed in one or more of the second and third upper regions of each of the first and second door interior materials 530D1 and 530D2. For example, the one or more sound generating apparatuses 10 may be disposed in one or more of the first to third upper regions of one or more of the first to fourth door interior materials 530D1 to 530D4. For example, the one or more sound generating apparatuses 10 configured to vibrate the first upper region of one or more of the first and second door interior materials 530D1 and 530D2 may be configured to output a sound of 2 kHz to 20 kHz, and the one or more sound generating apparatuses 10 configured to vibrate one or more of the second and third upper regions of each of the first and second door interior materials 530D1 and 530D2 may be configured to output a sound of 2 kHz to 20 kHz or may be configured to output a sound of 150 Hz to 20 kHz. For example, the one or more sound generating apparatuses 10 configured to vibrate one or more of the second and third upper regions of one or more of the first and second door interior materials 530D1 and 530D2 may be configured to output a sound of 2 kHz to 20 kHz, or may be configured to output a sound of 150 Hz to 20 kHz.

According to an embodiment of the present disclosure, one or more sound generating apparatuses 10 may be disposed between a seat frame and the seat interior material and may be configured to indirectly or directly vibrate the seat interior material to output a sound. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be referred to as a sheet speaker, a headrest speaker, or a fifth speaker, but embodiments of the present disclosure are not limited thereto.

According to an embodiment of the present disclosure, the seat frame may include a first seat frame (or a driver seat frame), a second seat frame (or a front passenger seat frame), a third seat frame (or a first passenger seat frame), a fourth seat frame (or a second passenger seat frame), and a fifth seat frame (or a third passenger seat frame). According to an embodiment of the present disclosure, the seat interior material may include a first seat interior material surrounding the first seat frame, a second seat interior material surrounding the second seat frame, a third seat interior material surrounding the third seat frame, a fourth seat interior material surrounding the fourth seat frame, and a fifth seat interior material surrounding the fifth seat frame.

According to an embodiment of the present disclosure, one or more of the first to fifth seat frames may include a seat floor frame, a seat rear frame, and a headrest frame. The seat interior material may include a seat floor interior material surrounding the seat floor frame, a seat rear interior material surrounding the seat rear frame, and a headrest interior material surrounding the headrest frame. One or more of the seat floor interior material, the seat rear interior material, and the headrest interior material may include a seat internal interior material and a seat external interior material. The seat internal interior material may include a foam layer. The seat external interior material may include a skin layer including fiber or leather. The seat external interior material may further include a base layer including a plastic material, which supports the skin layer.

According to an embodiment of the present disclosure, the one or more sound generating apparatuses 10 may be disposed in one or more of a region between the seat rear frame and the seat rear interior material and a region between the headrest frame and the headrest interior material, and thus, may vibrate one or more of the seat external interior material of the seat rear interior material and a seat external interior material of the headrest interior material.

According to an embodiment of the present disclosure, the one or more sound generating apparatuses 10 disposed in one or more of the driver seat DS and the front passenger seat FPS may be disposed in one or more of a region between the seat rear frame and the seat rear interior material and a region between the headrest frame and the headrest interior material.

According to an embodiment of the present disclosure, the one or more sound generating apparatuses 10 disposed in one or more of the first to third passenger seats RPS1 to RPS3 may be disposed between the headrest frame and the headrest interior material. For example, one or more of the first to third passenger seats RPS1 to RPS3 may include one or more sound generating apparatuses 10 disposed between the headrest frame and the headrest interior material.

According to an embodiment of the present disclosure, the one or more sound generating apparatuses 10 vibrating the seat rear interior material of one or more of the driver seat DS and the front passenger seat FPS may be configured to output a sound of 150 Hz to 20 kHz.

According to an embodiment of the present disclosure, the one or more sound generating apparatuses 10 vibrating the headrest interior material of one or more of the driver seat DS, the front passenger seat FPS, and the first to third passenger seats RPS1 to RPS3 may be configured to output a sound of 2 kHz to 20 kHz, or may be configured to output a sound of 150 Hz to 20 kHz.

Referring to FIG. 15, the one or more sound generating apparatuses 10 according to an embodiment of the present disclosure may be disposed between a handle frame and the handle interior material 530F and may be configured to indirectly or directly vibrate the handle interior material 530F to output a sound. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be referred to as a handle speaker, a steering speaker, or a sixth speaker, but embodiments of the present disclosure are not limited thereto.

According to the embodiment of the present disclosure, the one or more sound generating apparatuses 10 may provide sound to a driver by indirectly or directly vibrating the handle interior material 530F. The sound output by the one or more sound generating apparatuses 10 in the handle interior material 530F may be the same as or different from the sound output by each of the one or more sound generating apparatuses 10 between the dash panel and the dashboard 530A, the one or more sound generating apparatuses 10 between the pillar panel and the pillar interior material 530B, the one or more sound generating apparatuses 10 between the roof panel and the roof interior material 530C, the one or more sound generating apparatuses 10 between the door frame and door interior material 530D and the one or more sound generating apparatuses 10 between the seat frame and the seat interior material. For example, the sound output by the one or more sound generating apparatuses 10 may be the same as or different from the sound output by at least one of the one or more sound generating apparatuses 10 between the dash panel and the dashboard 530A, the one or more sound generating apparatuses 10 between the pillar panel and the pillar interior material 530B, the one or more sound generating apparatuses 10 between the roof panel and the roof interior material 530C, the one or more sound generating apparatuses 10 between the door frame and door interior material 530D and the one or more sound generating apparatuses 10 between the seat frame and the seat interior material. According to an embodiment of the present disclosure, the one or more sound generating apparatuses 10 in the handle interior material 530F may output sound provided only to a driver. According to another embodiment of the present disclosure, the sound output by the one or more sound generating apparatuses 10 in the handle interior material 530F and the sound output by each of the one or more sound generating apparatuses 10 between the dash panel and the dashboard 530A, the one or more sound generating apparatuses 10 between the pillar panel and the pillar interior material 530B, the one or more sound generating apparatuses 10 between the roof panel and the roof interior material 530C, the one or more sound generating apparatuses 10 between the door frame and door interior material 530D and the one or more sound generating apparatuses 10 between the seat frame and the seat interior material may be output by being combined with each other. For example, the sound output by the one or more sound generating apparatuses 10 in the handle interior material 530F and the sound output by at least one of the one or more sound generating apparatuses 10 between the dash panel and the dashboard 530A, the one or more sound generating apparatuses 10 between the pillar panel and the pillar interior material 530B, the one or more sound generating apparatuses 10 between the roof panel and the roof interior material 530C, the one or more sound generating apparatuses 10 between the door frame and door interior material 530D and the one or more sound generating apparatuses 10 between the seat frame and the seat interior material may be output by being combined with each other.

According to the embodiment of the present disclosure, the one or more sound generating apparatuses 10 may be disposed between a floor panel and the floor interior material 530G and may be configured to indirectly or directly vibrate the floor interior material 530G to output a sound. The one or more sound generating apparatuses 10 may be disposed between the floor panel and the floor interior material 530G disposed between front seats DS and FPS and a third rear passenger seat RPS3. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be configured to output a sound of 150 Hz to 20 kHz. For example, the one or more sound generating apparatuses 10 may be referred to as a floor speaker, a bottom speaker, an under-speaker, or a seventh speaker, but embodiments of the present disclosure are not limited thereto.

The vehicular apparatus according to the embodiment of the present disclosure may further include one or more sound generating apparatuses 10 disposed in the interior material 530 exposed to an indoor space. For example, the vehicular apparatus according to the embodiment of the present disclosure may include only the one or more sound generating apparatuses 10 disposed in the interior material 530 exposed to the indoor space instead of the one or more sound generating apparatuses 10 disposed in the interior material 530, or may include both the one or more sound generating apparatuses 10 disposed in the interior material 530 and the one or more sound generating apparatuses 10 disposed in the interior material 530 exposed to the indoor space. For example, the one or more sound generating apparatuses 10 disposed in the interior material 530 and/or the one or more sound generating apparatuses 10 disposed in the interior material 530 exposed to the indoor space may be disposed in the interior material 530 to output sound. For example, the interior material 530 may output sound in accordance with the vibration of the one or more sound generating apparatuses (or vibration apparatuses).

According to an embodiment of the present disclosure, the interior material 530 may further include a rear-view mirror 530H, an overhead console 530I, a rear package interior material 530J, a glove box, and a sun visor.

The one or more sound generating apparatuses 10 according to an embodiment of the present disclosure may be disposed in at least one of the rear-view mirror 530H, the overhead console 530I, the rear package interior material 530J, the glove box, and the sun visor. For example, the one or more sound generating apparatuses 10 may output sounds of one or more channels.

The one or more sound generating apparatuses 10 may be disposed in the rear-view mirror 530H and may be configured to indirectly or directly vibrate the rear-view mirror 530H to output a sound. The one or more sound generating apparatuses 10 may be disposed between a mirror housing connected to the main structure and the rear-view mirror 530H supported by the mirror housing. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be configured to output a sound of 150 Hz to 20 kHz. For example, the one or more sound generating apparatuses 10 may be referred to as a mirror speaker or an eighth speaker, but embodiments of the present disclosure are not limited thereto.

The one or more sound generating apparatuses 10 may be disposed in the overhead console 530I and may be configured to indirectly or directly vibrate a console cover of the overhead console 530I to output a sound. According to an embodiment of the present disclosure, the overhead console 530I may include a console box buried in the roof panel, a lighting mechanism disposed in the console box, and a console cover covering the lighting mechanism and the console box.

The one or more sound generating apparatuses 10 may be disposed between the console box and the console cover of the overhead console 530I and may vibrate the console cover. For example, the one or more sound generating apparatuses 10 may be disposed between the console box and the console cover of the overhead console 530I and may directly vibrate the console cover. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be configured to output a sound of 150 Hz to 20 kHz. For example, the one or more sound generating apparatuses 10 may be referred to as a console speaker, a lighting speaker, or a ninth speaker, but embodiments of the present disclosure are not limited thereto.

The vehicular apparatus according to an embodiment of the present disclosure may further include a center lighting box which is disposed in a center region of the roof interior material 530C, a center lighting mechanism which is disposed in the center lighting box, and a center lighting cover which covers the center lighting mechanism. In this case, the one or more sound generating apparatuses 10 may additionally vibrate the center lighting cover which is additionally provided between the center lighting box and the center lighting cover.

Referring to FIG. 14, the one or more sound generating apparatuses 10 may be disposed in the rear package interior material 530J and may be configured to indirectly or directly vibrate the rear package interior material 530J to output a sound. The rear package interior material 530J may be disposed behind the first to third rear passenger seats RPS1 to RPS3. For example, a portion of the rear package interior material 530J may be disposed under a rear window 540C.

The one or more sound generating apparatuses 10 may be disposed at a rear surface of the rear package interior material 530J and may vibrate the rear package interior material 530J. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be referred to as a rear speaker or a tenth speaker, but embodiments of the present disclosure are not limited thereto.

According to an embodiment of the present disclosure, the rear package interior material 530J may include a first region corresponding to the first rear passenger seat RPS1, a second region corresponding to the second rear passenger seat RPS2, and a third region corresponding to the third rear passenger seat RPS3. According to an embodiment of the present disclosure, the one or more sound generating apparatuses 10 may be disposed to vibrate one or more of the first to third regions of the rear package interior material 530J. For example, the one or more sound generating apparatuses 10 may be disposed in each of the first and second regions of the rear package interior material 530J, or may be disposed in each of the first to third regions. For example, the one or more sound generating apparatuses 10 may be disposed in one or more of the first and second regions of the rear package interior material 530J, or may be disposed in one or more of the first to third regions. For example, the one or more sound generating apparatuses 10 may be configured to output a sound of 150 Hz to 20 kHz. For example, the one or more sound generating apparatuses 10 configured to vibrate each of the first to third regions of the rear package interior material 530J may have the same sound output characteristic or different sound output characteristics. For example, the one or more sound generating apparatuses 10 configured to vibrate one or more of the first to third regions of the rear package interior material 530J may have the same sound output characteristic or different sound output characteristics.

According to an embodiment of the present disclosure, the one or more sound generating apparatuses 10 may be disposed in the glove box and may be configured to indirectly or directly vibrate the glove box to output a sound. The glove box may be disposed in the dashboard 530A corresponding to a forward region with respect to the front passenger seat FPS.

The one or more sound generating apparatuses 10 may be disposed at an inner surface of the glove box and may vibrate the glove box. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be configured to output a sound of 150 Hz to 20 kHz, or may be one or more of a woofer, a mid-woofer, and a sub-woofer. For example, the one or more sound generating apparatuses 10 may be referred to as a glove box speaker or an eleventh speaker, but embodiments of the present disclosure are not limited thereto.

According to an embodiment of the present disclosure, the one or more sound generating apparatuses 10 may be disposed in the sun visor and may be configured to indirectly or directly vibrate the sun visor to output a sound. The sun visor may be a first sun visor corresponding to the driver seat DS and a second sun visor corresponding to the front passenger seat FPS.

The one or more sound generating apparatuses 10 may be disposed in one or more of the first sun visor and the second sun visor and may indirectly or directly vibrate one or more of the first sun visor and the second sun visor. For example, the one or more sound generating apparatuses 10 may include the sound apparatus 100 described above with reference to FIGS. 1 to 13B, and thus, repeated descriptions thereof are omitted. For example, the one or more sound generating apparatuses 10 may be configured to output a sound of 150 Hz to 20 kHz. For example, the one or more sound generating apparatuses 10 may be referred to as a sun visor speaker or a twelfth speaker, but embodiments of the present disclosure are not limited thereto.

According to an embodiment of the present disclosure, one or more of the first sun visor and the second sun visor may further include a sun visor mirror. In this case, the one or more sound generating apparatuses 10 may be configured to indirectly or directly vibrate the sun visor mirror of one or more of the first sun visor and the second sun visor. The one or more sound generating apparatuses 10 vibrating the sun visor mirror may include the sound apparatus 100 described above with reference to FIGS. 1 to 13B, and thus, repeated descriptions thereof are omitted.

Referring to FIG. 14, the vehicular apparatus according to the embodiment of the present disclosure may further include one or more sound generating apparatuses 10 disposed in a glass window 540. For example, the one or more sound generating apparatuses 10 may be disposed in the glass window 540 to output sound. For example, the glass window 540 may output sound in accordance with the vibration of the one or more sound generating devices (or vibration devices). For example, the one or more sound generating apparatuses 10 may be a window speaker, a transparent sound generating device, a transparent speaker or an opaque speaker, and the embodiments of the present disclosure are not limited thereto.

The one or more sound generating apparatuses 10 according to the embodiment of the present disclosure may be configured to output sound by indirectly or directly vibrating the glass window 540. For example, the one or more sound generating apparatuses 10 may include one or more of the sound apparatuses 100 described with reference to FIGS. 1 to 13B, and may be configured to be transparent, translucent, or opaque.

According to an embodiment of the present disclosure, the glass window 540 may include a front window, a side window, and a rear window 540C. According to an embodiment of the present disclosure, the glass window 540 may further include a roof window. For example, when the vehicular apparatus includes the roof window, a portion of a region of each of the roof frame and the roof interior material 530C may be replaced with the roof window. For example, when the vehicular apparatus includes the roof window, the one or more sound generating apparatuses 10 may be configured to indirectly or directly vibrate an edge portion (or a periphery portion) of the roof interior material 530C surrounding the roof window to output a sound.

According to an embodiment of the present disclosure, the one or more sound generating apparatuses 10 may be disposed in the front window and may be configured to output a sound based on a vibration thereof or to indirectly or directly vibrate the front window to output a sound.

According to an embodiment of the present disclosure, the front window may include a first region corresponding to the driver seat DS, a second region corresponding to the front passenger seat FPS, and a third region (or a middle region) between the first region and the second region. For example, the one or more sound generating apparatuses 10 may be disposed in each of the first and second regions of the front window, or may be disposed in each of the first to third regions. For example, the one or more sound generating apparatuses 10 may be disposed in one or more of the first and second regions of the front window, or may be disposed in one or more of the first to third regions. For example, the one or more sound generating apparatuses 10 disposed in each of the first to third regions of the front window may have the same sound output characteristic or different sound output characteristics. For example, the one or more sound generating apparatuses 10 disposed in one or more of the first to third regions of the front window may have the same sound output characteristic or different sound output characteristics. For example, the one or more sound generating apparatuses 10 may be configured to output a sound of 150 Hz to 20 kHz. For example, the one or more sound generating apparatuses 10 may be referred to as a front window speaker or a thirteenth speaker, but embodiments of the present disclosure are not limited thereto.

Referring to FIG. 15, the one or more sound generating apparatuses 10 according to an embodiment of the present disclosure may be disposed in the side window and may be configured to output a sound based on a vibration thereof or to indirectly or directly vibrate the side window to output a sound.

According to an embodiment of the present disclosure, the side window may include a first side window (or a left front window), a second side window (or a right front window) 540B2, a third side window (or a left rear window), and a fourth side window (or a right rear window) 540B4.

According to an embodiment of the present disclosure, the one or more sound generating apparatuses 10 may be disposed in one or more of the first to fourth side windows. For example, one or more of the first to fourth side windows may include one or more sound generating apparatuses 10.

According to an embodiment of the present disclosure, the one or more sound generating apparatuses 10 may be disposed in one or more of the first to fourth side windows and may be configured to output a sound based on a vibration thereof or to indirectly or directly vibrate the first to fourth side windows to output a sound. For example, the one or more sound generating apparatuses 10 may be configured to output a sound of 150 Hz to 20 kHz. For example, the one or more sound generating apparatuses 10 disposed in one or more of the first to fourth side windows may have the same sound output characteristic or different sound output characteristics. For example, the one or more sound generating apparatuses 10 may be configured to output a sound of 150 Hz to 20 kHz. For example, the one or more sound generating apparatuses 10 may be referred to as a side window speaker or a fourteenth speaker, but embodiments of the present disclosure are not limited thereto.

Referring to FIG. 14, the one or more sound generating apparatuses 10 may be disposed in the rear window 540C and may be configured to output a sound based on a vibration thereof or to indirectly or directly vibrate the rear window 540C to output a sound.

According to an embodiment of the present disclosure, the rear window 540C may include a first region corresponding to a rearward direction of the first rear passenger seat RPS1, a second region corresponding to a rearward direction of the second rear passenger seat RPS2, and a third region corresponding to a rearward direction of the third rear passenger seat RPS3. According to an embodiment of the present disclosure, the one or more sound generating apparatuses 10 may be disposed in each of the first to third regions of the rear window 540C. For example, the one or more sound generating apparatuses 10 may be disposed in one or more of the first to third regions of the rear window 540C. For example, the one or more sound generating apparatuses 10 may be disposed in each of the first and second regions of the rear window 540C, or may be disposed in each of the first to third regions of the rear window 540C. For example, the one or more sound generating apparatuses 10 may be disposed in one or more of the first and second regions of the rear window 540C, or may be disposed in one or more of the first to third regions of the rear window 540C. For example, the one or more sound generating apparatuses 10 may be configured to output a sound of 150 Hz to 20 kHz. For example, the one or more sound generating apparatuses 10 disposed in each of the first to third regions of the rear window 540C may have the same sound output characteristic or different sound output characteristics. For example, the one or more sound generating apparatuses 10 disposed in one or more of the first to third regions of the rear window

540C may have the same sound output characteristic or different sound output characteristics. For example, the one or more sound generating apparatuses 10 disposed in one or more of the first and second regions of the rear window 540C may be configured to output a sound of 150 Hz to 20 kHz, or may be one or more of a woofer, a mid-woofer, and a sub-woofer. For example, the one or more sound generating apparatuses 10 may be referred to as a rear window speaker or a fifteenth speaker, but embodiments of the present disclosure are not limited thereto.

According to another embodiment of the present disclosure, the one or more sound generating apparatuses 10 may be disposed in the roof window and may be configured to output a sound based on a vibration thereof or to indirectly or directly vibrate the roof window to output a sound.

The roof window according to an embodiment of the present disclosure may be disposed on front seats DS and FPS. For example, the one or more sound generating apparatuses 10 may be disposed in a center region of the roof window. For example, the one or more sound generating apparatuses 10 may be configured to output a sound of 150 Hz to 20 kHz. For example, the one or more sound generating apparatuses 10 may be referred to as a roof window speaker or a sixteenth speaker, but embodiments of the present disclosure are not limited thereto.

According to another embodiment of the present disclosure, the roof window may be disposed on the front seats DS and FPS, or may be disposed on the rear passenger seats RPS1 to RPS3. For example, the roof window may include a first region corresponding to the front seats DS and FPS and a second region corresponding to the rear passenger seats RPS1 to RPS3. Also, the roof window may include a third region between the first region and the second region. For example, the one or more sound generating apparatuses 10 may be disposed in one or more of the first and second regions of the roof window, or may be disposed in one or more of the first to third regions of the roof window. For example, the one or more sound generating apparatuses 10 may be configured to output a sound of 150 Hz to 20 kHz. For example, the one or more sound generating apparatuses 10 disposed in one or more of the first to third regions of the roof window may have the same sound output characteristic or different sound output characteristics.

Referring to FIGS. 14 and 15, the vehicular apparatus according to an embodiment of the present disclosure may further include a woofer speaker WS which is provided in one or more of the dashboard 530A, the door frame, and the rear package interior material 530J.

The woofer speaker WS according to an embodiment of the present disclosure may be one or more of a woofer, a mid-woofer, and a sub-woofer. For example, the woofer speaker WS may be referred to as the term such as a speaker which outputs a sound of 60 Hz to 150 Hz, but embodiments of the present disclosure are not limited thereto.

Accordingly, the woofer speaker WS may output a sound of 60 Hz to 150 Hz, thereby enhancing a low-pitched sound band characteristic of a sound which is output to an indoor space.

According to an embodiment of the present disclosure, the woofer speaker WS may be disposed in one or more of the first and second regions of the dashboard 530A. According to an embodiment of the present disclosure, the woofer speaker WS may be disposed in each of the first to fourth door frames of the door interior material 530D and may be exposed at a lower region of each of the first to fourth door interior materials 530D1 to 530D4 of the door interior material 530D. For example, the woofer speaker WS may be disposed in one or more of the first to fourth door frames of the door interior material 530D and may be exposed at the lower region of one or more of the first to fourth door interior materials 530D1 to 530D4 of the door interior material 530D. According to an embodiment of the present disclosure, the woofer speaker WS may be disposed in one or more of the first and second regions of the rear package interior material 530J. For example, the one or more sound generating apparatuses 10 disposed in the lower region of each of the first to fourth door interior materials 530D1 to 530D4 may be replaced with the woofer speaker WS. For example, the one or more sound generating apparatuses 10 disposed in the lower region of one or more of the first to fourth door interior materials 530D1 to 530D4 may be replaced with the woofer speaker WS.

The vehicular apparatus according to an embodiment of the present disclosure may further include a garnish member which covers a portion of the interior material 530 exposed at the indoor space and one or more sound generating apparatuses 10 disposed at the interior material 530. For example, the one or more sound generating apparatuses 10 may be disposed in a garnish member and the interior material 530 to output a sound. For example, one or more of the garnish member and the interior material 530 may output a sound based on vibrations of one or more vibration generating apparatuses (or vibration apparatus).

The garnish member may be configured to cover a portion of the door interior material 530D exposed at an indoor space, but embodiments of the present disclosure are not limited thereto. For example, the garnish member may be configured to cover a portion of one or more among the dashboard 530A, the pillar interior material 530B, and the roof interior material 530C, which are exposed at the indoor space.

The garnish member according to an embodiment of the present disclosure may include a metal material or a non-metal material (or a composite nonmetal material) having a material characteristic suitable for generating a sound based on a vibration. For example, a metal material of the garnish member may include any one or more materials of stainless steel, aluminum (Al), an Al alloy, a magnesium (Mg), a Mg alloy, and a magnesium-lithium (Mg—Li) alloy, but embodiments of the present disclosure are not limited thereto. The nonmetal material (or the composite nonmetal material) of the garnish member may include one or more of wood, plastic, glass, metal, cloth, fiber, rubber, paper, and leather, but embodiments of the present disclosure are not limited thereto. For example, the garnish member may include a metal material having a material characteristic suitable for generating a sound of a high-pitched sound band, but embodiments of the present disclosure are not limited thereto. For example, the high-pitched sound band may have a frequency of 1 kHz or more or 3 kHz or more, but embodiments of the present disclosure are not limited thereto.

The one or more sound generating apparatuses 10 may be disposed between the garnish member and the interior material 530. For example, the one or more sound generating apparatuses 10 may be referred to as the term such as a garnish speaker or a seventeenth speaker, or the like, but embodiments of the present disclosure are not limited thereto.

The one or more sound generating apparatuses 10 according to an embodiment of the present disclosure may include one or more of the sound apparatuses 100 described above with reference to FIGS. 1 to 13B. The one or more sound generating apparatuses 10 may be disposed in a main interior material 530 and a garnish member and may be connected or coupled to the garnish member.

The one or more sound generating apparatuses 10 according to an embodiment of the present disclosure may be configured to indirectly or directly vibrate the garnish member to output a sound into the indoor space of the vehicular apparatus. For example, the one or more sound generating apparatuses 10 may be configured to output a sound of a high-pitched sound band, but embodiments of the present disclosure are not limited thereto.

Referring to FIGS. 14 and 15, the vehicular apparatus according to an embodiment of the present disclosure may further include one or more sound generating apparatuses 10 disposed at an inner surface of the exterior material 520. For example, the one or more sound generating apparatuses 10 may be disposed in the exterior material 520 to output a sound. For example, the exterior material 520 may output a sound based on vibrations of one or more vibration generating apparatuses (or vibration apparatus).

The exterior material 520 according to the embodiment of the present disclosure may include at least one of a hood panel 520A, a front fender panel 520B, a door frame, a roof panel, a pillar panel, a trunk panel 520C, a front bumper, a rear bumper, a spoiler, a headlight, a taillight, a fog light or a vehicle body bottom CB. The one or more sound generating devices may vibrate at least one of the hood panel 520A, the front fender panel 520B, the door frame, the roof panel, the pillar panel, the trunk panel 520C, the front bumper, the rear bumper, the spoiler, the headlight, the taillight, the fog light or the vehicle body bottom CB from the outside (or outer surface) or the inside (or inner surface).

The one or more sound generating apparatuses 10 may be disposed in one or more of the hood panel 520A, the front fender panel 520B, and the trunk panel 520C. Therefore, sound of one or more channels may be output.

The one or more sound generating apparatuses 10 according to the embodiment of the present disclosure may be connected or coupled to the inner side of the hood panel 520A, and may be configured to output sound to an external space of the vehicular apparatus by indirectly or directly vibrating the hood panel 520A. For example, the one or more sound generating apparatuses 10 may be configured to be connected or coupled to one or more of a central portion and an edge portion of the inner side of the hood panel 520A.

The one or more sound generating apparatuses 10 according to an embodiment of the present disclosure may include one or more of the sound apparatuses 100 described above with reference to FIGS. 1 to 13B. The one or more sound generating apparatuses 10 may be connected or coupled to an inner surface of a hood panel 520A. For example, the one or more sound generating apparatuses 10 may be configured to output a sound of 150 Hz to 20 kHz. For example, the one or more sound generating apparatuses 10 may be referred to as a hood panel speaker or an eighteenth speaker, but embodiments of the present disclosure are not limited thereto.

The one or more sound generating apparatuses 10 according to an embodiment of the present disclosure may be connected or coupled to an inner surface of the front fender panel 520B and may be configured to indirectly or directly vibrate the front fender panel 520B to output a sound to the outdoor space of the vehicular apparatus. For example, the one or more sound generating apparatuses 10 may be disposed to have a certain interval at the inner surface of the front fender panel 520B.

The one or more sound generating apparatuses 10 according to an embodiment of the present disclosure may include the sound apparatuses 100 described above with reference to FIGS. 1 to 13B, and thus, the repetitive description thereof is omitted. The one or more sound generating apparatuses 10 may be connected or coupled to the inner surface of the front fender panel 520B. For example, the one or more sound generating apparatuses 10 may be configured to output a sound of about 150 Hz to about 20 kHz. For example, the one or more sound generating apparatuses 10 may be referred to as the term such as a fender panel speaker or a nineteenth speaker, or the like, but embodiments of the present disclosure are not limited thereto.

The one or more sound generating apparatuses 10 according to an embodiment of the present disclosure may be connected or coupled to an inner surface of the trunk panel 520C and may be configured to indirectly or directly vibrate the trunk panel 520C to output a sound to the outdoor space of the vehicular apparatus. For example, the one or more sound generating apparatuses 10 may be configured to be connected or coupled to one or more among a center portion and a periphery portion of the trunk panel 520C.

The one or more sound generating apparatuses 10 according to an embodiment of the present disclosure may include the sound apparatuses 100 disclosure described above with reference to FIGS. 1 to 13B, and thus, the repetitive description thereof is omitted. The one or more sound generating apparatuses 10 may be connected or coupled to the inner surface of the trunk panel 520C. For example, the one or more sound generating apparatuses 10 may be configured to output a sound of about 150 Hz to about 20 kHz. For example, the one or more sound generating apparatuses 10 may be referred to as the term such as a trunk panel speaker or a twentieth speaker, or the like, but embodiments of the present disclosure are not limited thereto.

According to another embodiment of the present disclosure, the one or more sound generating apparatuses 10 may be disposed on at least one of a door inner panel or a door outer panel.

Referring to FIG. 15, the vehicular apparatus according to the embodiment of the present disclosure may further include a battery module BM and a vehicle body bottom CB.

For example, the battery module BM may be disposed in the exterior material 520. For example, the vehicle body bottom CB may cover the battery module BM. The vehicle body bottom CB may be a vehicle body panel, and the embodiments of the present disclosure are not limited thereto.

An eco-friendly vehicular apparatus having no noise, such as an electric vehicle, has a problem that a pedestrian cannot recognize when the vehicular apparatus moves. Therefore, the vehicular apparatus is equipped with an AVAS capable of recognizing a risk.

According to the embodiment of the present disclosure, the vehicular apparatus may further include an Acoustic Vehicle Alert System (AVAS), and the AVAS may be a device for transferring a location and/or driving information of the vehicular apparatus to a pedestrian. The AVAS may be a virtual engine sound system and a vehicle access information device, and the embodiments of the present disclosure are not limited thereto.

For example, the AVAS may be configured in an engine in front of the vehicular apparatus. Therefore, there is a problem that front sound of the vehicular apparatus cannot be output to be equivalent to rear sound. In addition, when the sound of the back side of the vehicular apparatus is matched with the sound apparatus at the front side, problems occur in that the front sound relatively becomes louder and sound is introduced into the indoor. Therefore, the inventors of the present disclosure have carried out various studies and experiments for adjusting front sound and rear source of a vehicular apparatus to equivalent sound. This will be described below.

The one or more sound generating apparatuses 10 may be disposed between the battery module BM and the vehicle body bottom CB. Referring to FIG. 14, the one or more sound generating apparatuses 10 may be disposed at the center of the vehicular apparatus. For another example, the one or more sound generating apparatuses 10 may be disposed in one or more of the front, back, left, or right of the vehicular apparatus.

According to the embodiment of the present disclosure, the one or more sound generating apparatuses 10 disposed between the battery module BM and the vehicle body bottom CB may be an AVAS. Therefore, since the problem that the front sound is different from the rear sound when the AVAS is disposed on an engine of the vehicular apparatus may be solved, the AVAS having the equivalent sound may be provided around the vehicular apparatus. In addition, since the AVAS may be disposed in the portion that is shielded from the indoor of the vehicular apparatus, sound and/or noise introduced into the indoor may be minimized or reduced. According to the embodiment of the present disclosure, since the AVAS may be implemented by the sound apparatus 100 having the connection member 145 described with reference to FIGS. 3 to 5, the AVAS with improved sound characteristics in the middle/low-pitched range and/or the high-pitched range may be provided, and the degree of freedom in arrangement of the vehicular apparatus may be improved.

The vehicular apparatus according to the embodiment of the present disclosure may output sound to one or more of the indoor space and the external space through at least one of the one or more sound generating apparatuses 10 disposed in the interior material 530, the one or more sound generating apparatuses 10 disposed in the interior material 530 exposed to the indoor space, the one or more sound generating apparatuses 10 disposed in the glass window 540, the one or more sound generating apparatuses 10 disposed in a garnish member, and the one or more sound generating apparatuses 10 disposed on the exterior material 520, thereby outputting sound by using one or more of the exterior material 520 and the interior material 530 as a sound vibration plate and outputting surround stereoscopic sound including multiple channels.

A sound apparatus and a vehicular apparatus comprising the same according to various embodiments of the present disclosure will be described below.

A sound apparatus according to various embodiments of the present disclosure may include a vibration member, an enclosure at a rear surface of the vibration member, a connection member between the vibration member and the enclosure, movably supporting an edge of the vibration member, and a vibration apparatus vibrating the vibration member.

According to various embodiments of the present disclosure, the vibration member may have a planar structure or non-planar structure.

According to various embodiments of the present disclosure, the vibration member may include a protrusion portion connected to the connection member.

According to various embodiments of the present disclosure, the protrusion portion may be protruded from the rear surface of the vibration member, and the connection member may include a groove for accommodating the protrusion portion.

According to various embodiments of the present disclosure, the connection member may include a first supporting portion supporting a rear edge of the vibration member, the first supporting portion may include an inner space and a hole connected to the inner space, and the protrusion portion may be accommodated in the hole of the first supporting portion.

According to various embodiments of the present disclosure, the enclosure may include a bottom portion, and a side portion connected to an edge of the bottom portion and connected to the connection member.

According to various embodiments of the present disclosure, the connection member may include a first connection portion connected to the vibration member, and a second connection portion connected to the enclosure, and each of the first connection portion and the second connection portion may have elasticity.

According to various embodiments of the present disclosure, the vibration member may include a protrusion portion connected to the first connection portion, and the enclosure may include a side portion connected to the second connection portion.

According to various embodiments of the present disclosure, the first connection portion may include a first accommodation portion for accommodating the protrusion portion, and a second accommodation portion for accommodating the side portion.

According to various embodiments of the present disclosure, the connection member may be made of a flexible material having elasticity.

According to various embodiments of the present disclosure, the vibration apparatus may include a vibration device, and the vibration device may include a vibration portion, a first electrode portion at a first surface of the vibration portion, and a second electrode portion at a surface different from the first surface of the vibration portion.

According to various embodiments of the present disclosure, the vibration portion may include an inorganic material portion having piezoelectric characteristics.

According to various embodiments of the present disclosure, the vibration portion may include a plurality of inorganic material portions having piezoelectric characteristics, and an organic material portion between the plurality of inorganic material portions.

According to various embodiments of the present disclosure, the vibration apparatus may include a first cover member at the first electrode portion, and a second cover member at the second electrode portion.

According to various embodiments of the present disclosure, the vibration apparatus may include a first adhesive layer between the first cover member and the first electrode portion, and a second adhesive layer between the second cover member and the second electrode portion.

According to various embodiments of the present disclosure, the sound apparatus may further include one or more buffer members below the vibration apparatus.

According to various embodiments of the present disclosure, the one or more buffer members may include a first buffer member and a second buffer member on the first buffer member, and the first buffer member may be made of a material having an elastic modulus different from that of the second buffer member.

According to various embodiments of the present disclosure, the second buffer member may include a pattern in a direction perpendicular to a bending direction of the vibration member.

According to various embodiments of the present disclosure, the vibration member may include a metal material, or includes a single non-metallic or composite non-metallic material of at least one of wood, rubber, plastic, carbon, glass, fiber, cloth, paper or leather.

According to various embodiments of the present disclosure, the vibration apparatus may further include a signal cable.

According to various embodiments of the present disclosure, the connection member may include an opening through which the signal cable passes, and the remaining portion of a portion between the vibration member and the enclosure except for the opening may be sealed.

According to various embodiments of the present disclosure, the vibration member may include one or more of a display panel having a pixel for displaying an image, a screen panel for projecting an image from a display device, a lighting panel, a signage panel, an interior material of a transportation means, a glass window of the transportation means, an exterior material of the transportation means, a ceiling material of a building, an interior material of the building, a glass window of the building, an interior material of an aircraft, a glass window of the aircraft, metal, wood, rubber, plastic, carbon, glass, fiber, fabric, paper, leather or mirror.

A vehicular apparatus according to various embodiments of the present disclosure may include an exterior material, an interior material covering the exterior material, and one or more sound generating apparatuses in the exterior material, in the interior material and/or between the exterior material and the interior material. The one or more sound generating apparatuses may include a vibration member, an enclosure at a rear surface of the vibration member, a connection member between the vibration member and the enclosure, movably supporting an edge of the vibration member, and a vibration apparatus vibrating the vibration member. The one or more of the interior material and the exterior material may output sound in accordance with vibration of the one or more sound generating apparatuses.

According to various embodiments of the present disclosure, one of the interior material and the exterior material may be made of an enclosure of the sound apparatus.

According to various embodiments of the present disclosure, one of the interior material and the exterior material may be made of a vibration member of the sound apparatus.

According to various embodiments of the present disclosure, the interior material may include at least one of a dash board, a pillar interior material, a roof interior material, a door interior material, a seat interior material, a handle interior material, a floor interior material or a rear package interior material, and the one or more sound generating apparatuses may vibrate at least one of the dash board, the pillar interior material, the roof interior material, the door interior material, the seat interior material, the handle interior material, the floor interior material or the rear package interior material.

According to various embodiments of the present disclosure, the exterior material may include at least one of a hood panel, a front fender panel, a door frame, a roof panel, a pillar panel, a trunk panel, a front bumper, a rear bumper, a spoiler, a headlight, a taillight, a fog light, or a vehicle body bottom, and the one or more sound generating apparatuses may vibrate at least one of the hood panel, the front fender panel, the door frame, the roof panel, the pillar panel, the trunk panel, the front bumper, the rear bumper, the spoiler, the headlight, the taillight, the fog light or the vehicle body bottom from an outer surface or an inner surface.

According to various embodiments of the present disclosure, the sound apparatus may further include a battery module disposed on the exterior material, the exterior material may include a vehicle body bottom covering the battery module, and the one or more sound generating apparatuses may be disposed between the battery module and the vehicle body bottom.

The sound apparatus according to an embodiment of the present disclosure may be applied to a sound apparatus provided in the apparatus. The apparatus according to an embodiment of the present disclosure may be applied to mobile devices, video phones, smart watches, watch phones, wearable devices, foldable devices, rollable devices, bendable devices, flexible devices, curved devices, sliding apparatus, variable apparatus, electronic organizers, electronic book, portable multimedia players (PMPs), personal digital assistants (PDAs), MP3 players, mobile medical devices, desktop personal computers (PCs), laptop PCs, netbook computers, workstations, navigation devices, automotive navigation devices, automotive display apparatuses, automotive apparatuses, theatrical apparatuses, theatrical display apparatuses, televisions (TVs), wall paper display apparatuses, signage devices, game machines, notebook computers, monitors, cameras, camcorders, home appliances, etc. Also, the sound apparatus according to embodiments of the present disclosure may be applied to organic light emitting lighting devices or inorganic light emitting lighting devices. In a case where the sound apparatus is applied to a lighting device, the sound apparatus may act as lighting and a speaker. Also, in a case where the sound apparatus according to embodiment of the present disclosure is applied to a mobile device, the sound apparatus may be one or more of a speaker, a receiver, or a haptic apparatus, but embodiments of the present disclosure are not limited thereto.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure. It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A sound apparatus comprising:
a vibration member;
an enclosure at a rear surface of the vibration member;
a connection member between the vibration member and the enclosure, the connection member movably supports an edge of the vibration member; and
a vibration apparatus configured to vibrate the vibration member,
wherein the vibration member includes a protrusion portion that is connected to the connection member,
wherein the connection member includes a first supporting portion that supports a rear edge of the vibration member, the first supporting portion including an inner space and a hole connected to the inner space, and
wherein the protrusion portion is accommodated in the hole of the first supporting portion.

2. The sound apparatus of claim 1, wherein the vibration member has a planar structure or non-planar structure.

3. The sound apparatus of claim 1, wherein the protrusion portion protrudes from the rear surface of the vibration member, and the connection member includes a groove that accommodates the protrusion portion.

4. The sound apparatus of claim 1, wherein the enclosure includes:

a bottom portion; and a side portion that is connected to an edge of the bottom portion and is connected to the connection member.

5. The sound apparatus of claim 1, wherein the connection member includes:

a first connection portion that is connected to the vibration member; and a second connection portion that is connected to the enclosure, wherein each of the first connection portion and the second connection portion has elasticity.

6. The sound apparatus of claim 5, wherein the vibration member includes a protrusion portion that is connected to the first connection portion, and the enclosure includes a side portion that is connected to the second connection portion.

7. The sound apparatus of claim 6, wherein the first connection portion includes:

a first accommodation portion that accommodates the protrusion portion; and a second accommodation portion that accommodates the side portion.

8. The sound apparatus of claim 1, wherein the connection member is made of a flexible material having elasticity.

9. The sound apparatus of claim 1, wherein the vibration apparatus includes a vibration device, the vibration device including:

a vibration portion;

a first electrode portion at a first surface of the vibration portion; and a second electrode portion at a surface different from the first surface of the vibration portion.

10. The sound apparatus of claim 9, wherein the vibration portion includes an inorganic material portion having piezoelectric characteristics.

11. The sound apparatus of claim 9, wherein the vibration portion includes:

a plurality of inorganic material portions having piezoelectric characteristics; and an organic material portion between the plurality of inorganic material portions.

12. The sound apparatus of claim 9, wherein the vibration apparatus includes:

a first cover member at the first electrode portion; and a second cover member at the second electrode portion.

13. The sound apparatus of claim 12, wherein the vibration apparatus includes:

a first adhesive layer between the first cover member and the first electrode portion; and a second adhesive layer between the second cover member and the second electrode portion.

14. The sound apparatus of claim 1, further comprising:

one or more buffer members below the vibration apparatus.

15. The sound apparatus of claim 14, wherein the one or more buffer members include a first buffer member and a second buffer member on the first buffer member, and the first buffer member is made of a material having an elastic modulus that is different from an elastic modulus of a material of the second buffer member.

16. The sound apparatus of claim 15, wherein the second buffer member includes a pattern in a direction perpendicular to a bending direction of the vibration member.

17. The sound apparatus of claim 1, wherein the vibration member includes a metal material, or includes a single non-metallic or composite non-metallic material including at least one of wood, rubber, plastic, carbon, glass, fiber, cloth, paper or leather.

18. The sound apparatus of claim 1, wherein the vibration apparatus further includes a signal cable.

19. The sound apparatus of claim 18, wherein the connection member includes an opening through which the signal cable passes, and a remaining portion of a portion between the vibration member and the enclosure except for the opening is sealed.

20. The sound apparatus of claim 1, wherein the vibration member includes one or more of a display panel having a pixel configured to display an image, a screen panel configured to project an image from a display device, a lighting panel, a signage panel, an interior material of a transportation means, a glass window of the transportation means, an exterior material of the transportation means, a ceiling material of a building, an interior material of the building, a glass window of the building, an interior material of an aircraft, a glass window of the aircraft, metal, wood, rubber, plastic, carbon, glass, fiber, fabric, paper, leather or mirror.

* * * * *